(12) United States Patent
Fuse

(10) Patent No.: US 6,211,996 B1
(45) Date of Patent: Apr. 3, 2001

(54) ANGLE MODULATOR

(75) Inventor: Masaru Fuse, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/573,849

(22) Filed: May 19, 2000

(30) Foreign Application Priority Data

May 19, 1999 (JP) .................................................. 11-138181
Aug. 20, 1999 (JP) .................................................. 11-233812

(51) Int. Cl.$^7$ .................................................. G02F 1/23
(52) U.S. Cl. .................................... 359/278; 359/238
(58) Field of Search .................................. 359/238, 237, 359/246, 247, 276, 278, 279

(56) References Cited

U.S. PATENT DOCUMENTS 5,973,820 * 10/1999 Fuse et al. ........................... 359/238

OTHER PUBLICATIONS

"Optical Super Wide–Band FM Modulation Scheme and Its Application to Multi–Channel AM Video Transmission Systems", K. Kikushime, et al., IOOC 1995, Technical Digest, vol. 5, PD2–7, pp. 33 and 34.

"High Capacity Hybrid Fibre–Radio Field Experiments at 60 Ghz", Harald Schmuck et al., Microwave Photonics, Technical Digest, Dec., 1996, pp. 65–68.

"Novel Technique For Generation of Optical SSB with Carrier Using a Single MZM to Overcome Fiber Chromatic Dispersion", G. H. Smith et al., Microwave photonics, Post–Deadline Papers Technical Digest, Dec. 1996, pp. 5–8.

* cited by examiner

Primary Examiner—Hung Xuan Dang
(74) Attorney, Agent, or Firm—Wenderoth, Lind & Ponack, L.L.P.

(57) ABSTRACT

An angle modulator branches a light emitted from a light source 101 into a first light and a second light. An optical intensity modulator 104 subjects the first light to predetermined optical intensity modulation with a first electrical signal having a predetermined frequency fc outputted from a first signal source 1031. An optical angle modulator 105 subjects the second light to optical angle modulation with a second electrical signal outputted from a second signal source 1032. An photo-detector 107 homodyne-detects an optical-intensity-modulated signal and an optical-angle-modulated signal that have been coupled by an optical coupler 106 using its square-law detection characteristics, and produces an angle-modulated signal having a center frequency fc as a beat signal. With the structure in which a wide-band angle-modulated signal is generated using the above optical signal processing, it is possible to achieve the angle modulator with suppressed noise independent of phase noise included in the light source.

43 Claims, 26 Drawing Sheets

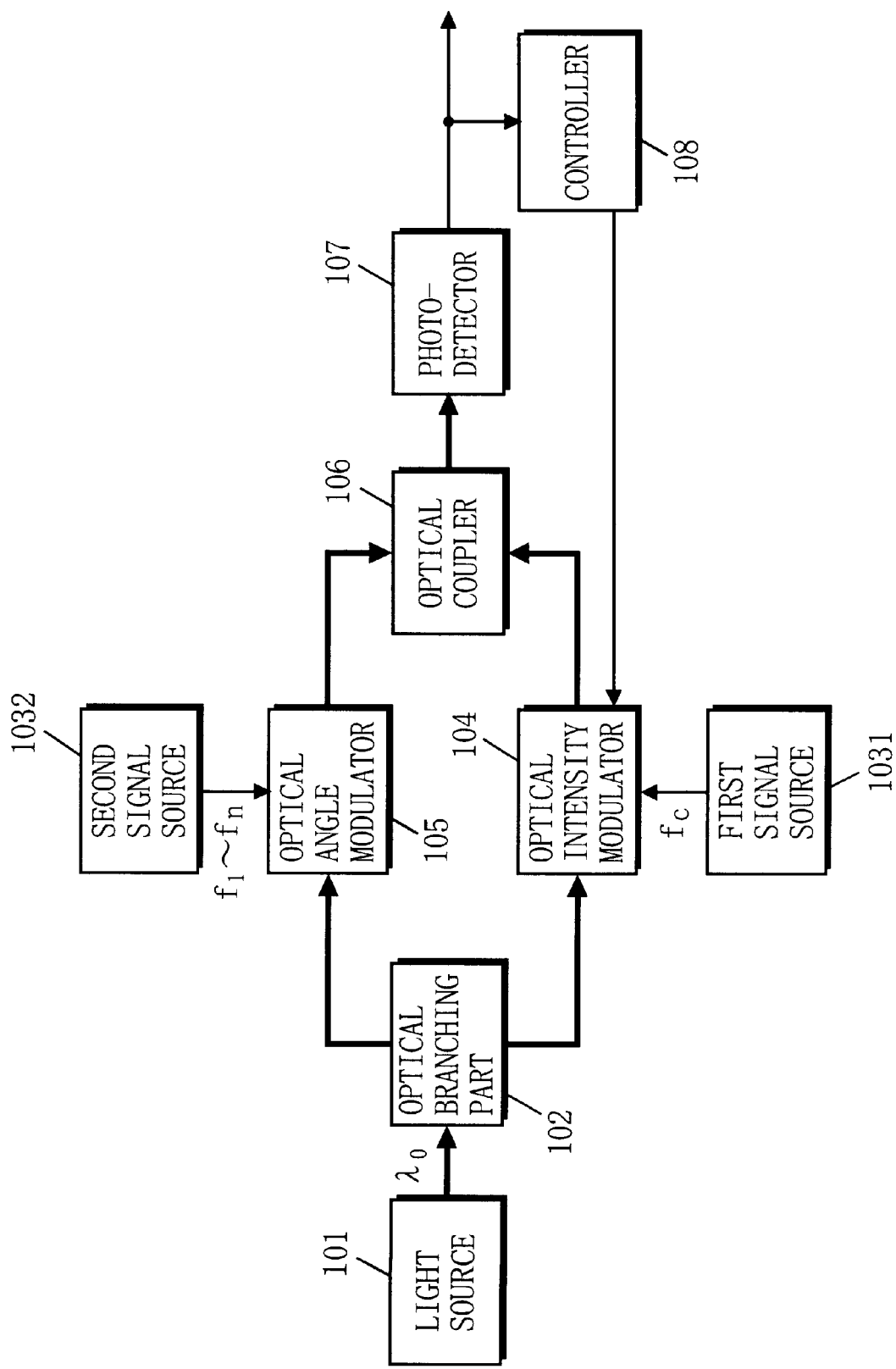
F I G. 7

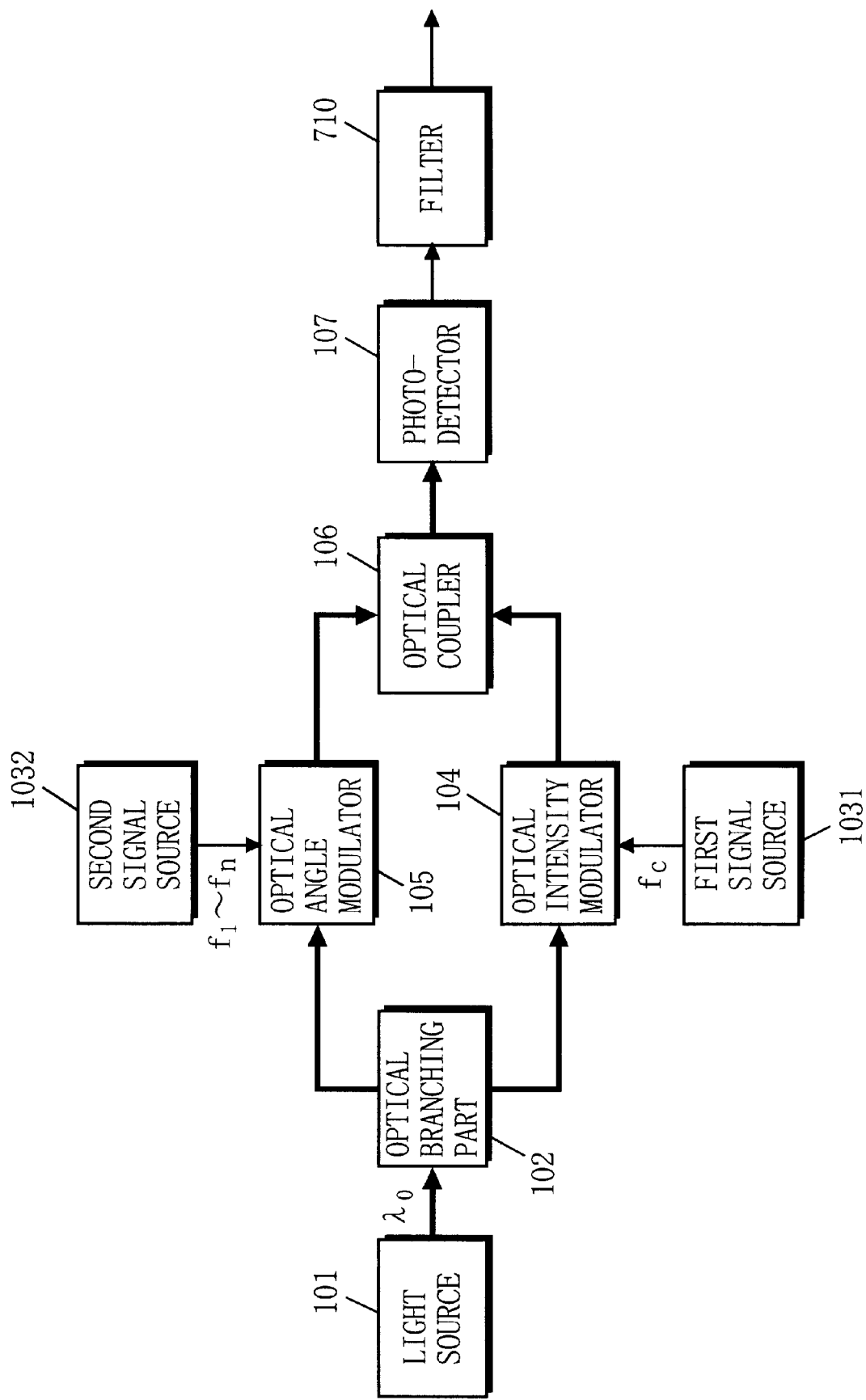

F I G. 1 6
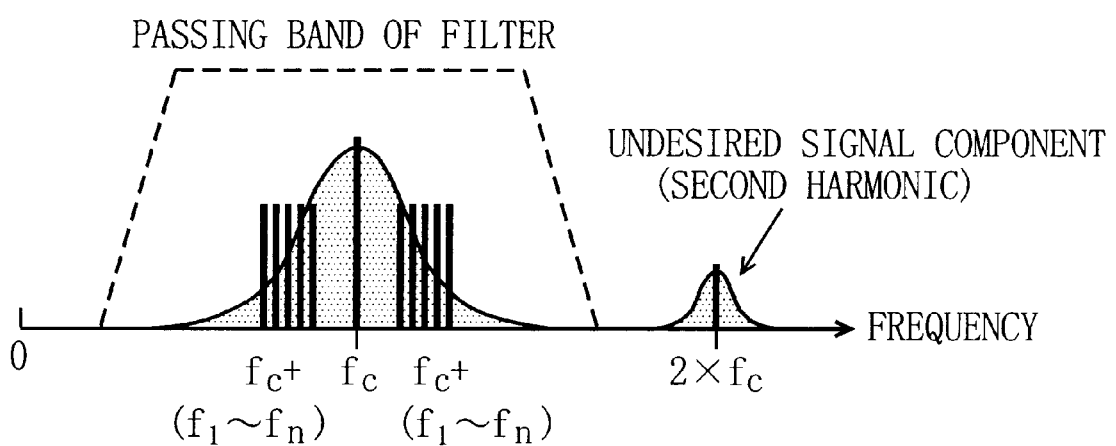

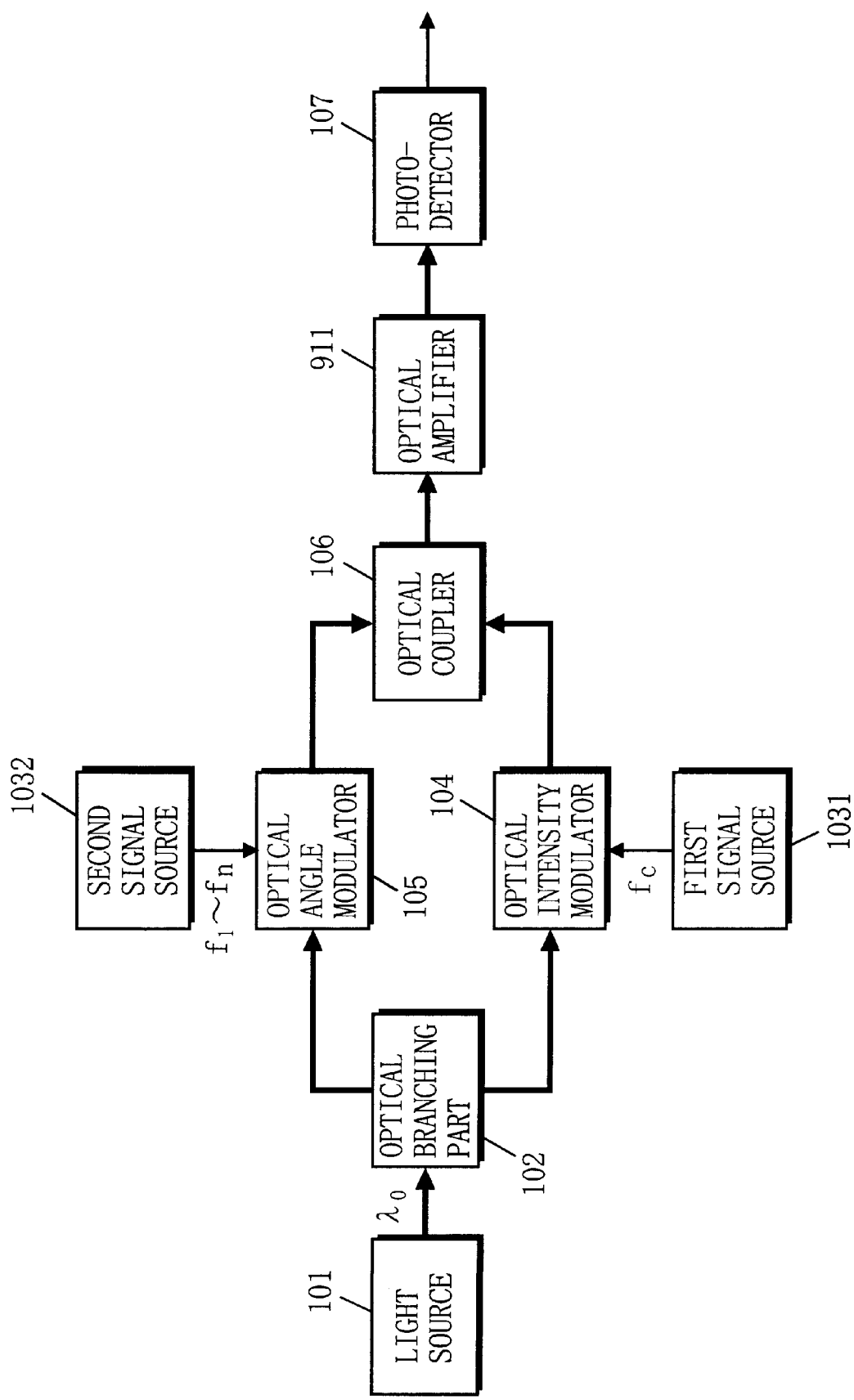

ANGLE MODULATOR

BACKGROUND OF THE INVENTION

1. Field of the Invention

The present invention relates to a modulator for generating a wide-band angle-modulated signal (phase-modulated signal or frequency-modulated signal), more specifically, through and an optical homodyne detection technique.

2. Description of the Background Art

FIG. 26 is a block diagram showing the configuration of a conventional angle modulator. Operation of such angle modulator is described in detail in documents such as "Optical Super Wide-Band FM Modulation Scheme and Its Application to Multi-Channel AM Video Transmission Systems", K. Kikushima, et al, IOOC 1995 Technical Digest, Vol. 5 PD2–7, pp. 33–34, which is incorporated herein by reference. The angle modulator shown in FIG. 26 includes an optical frequency controller 1000, a signal source 1001, a local light source 1004, an optical modulator 1005, an optical coupler 1006, and a photo-detector 1007.

In the above angle modulator, the signal source 1001 produces an electrical signal, which is an original signal for angle modulation. The optical modulator 1005 is implemented as, for example, a semiconductor laser. In general, the semiconductor laser emits a light having a constant optical frequency f1, provided that an injection current is constant. When the injection current is amplitude-modulated, the optical frequency is also subjected to modulation, and the semiconductor laser emits an optical-frequency-modulated signal centering on the optical frequency f1. With such characteristic, the optical modulator 1005 converts the electrical signal supplied by the signal source 1001 into an optical-frequency-modulated signal for output. FIG. 27B is a schematic diagram illustrating a frequency spectrum of light outputted from the optical modulator 1005.

The local light source 1004 produces an unmodulated light having a constant optical frequency f2. FIG. 27A is a schematic diagram illustrating a frequency spectrum of light outputted from the light source 1004. The optical signal from the optical modulator 1005 and the light from the local light source 1004 are coupled by the optical coupler 1006, and then supplied to the photo-detector 1007.

The photo-detector 1007 is implemented as a photodiode having square-law detection characteristics, for example. The photo-detector 1007 produces a beat signal of the two input lights at a frequency fc equal to the optical frequency difference (=|f1−f2|) between the two optical signals L1 and L2. This operation is called optical heterodyne detection.

The beat signal obtained in the above described manner is an angle-modulated signal (frequency-modulated signal) of the carrier frequency fc, and its original signal is the electrical signal from the signal source 1001. FIG. 27C is a schematic diagram illustrating a frequency spectrum of the signal outputted from the optical detector 1007.

The optical frequency controller 1000 controls one or both of the center optical frequency f1 of the optical signal outputted from the optical modulator 1005 and the optical frequency f2 of the light outputted from the local light source 1004 to stabilize the center frequency fc of the angular-modulated signal outputted from the optical detector 1007.

As described above, with the use of high frequency modulation efficiency by optical signal processing (more than ten times the frequency modulation efficiency in ordinary electric circuit systems), the conventional angle modulator can easily generate an extremely high-frequency, wide-band angle-modulated signal (with large frequency deviation or phase deviation), which is difficult to be produced in the ordinary electric circuits.

However, light sources such as semiconductor lasers generally have large phase noise (oscillation spectrum line width), compared with electric oscillators. Phase noise included in the light from the local light source is represented by $\Delta v1$ in FIG. 27A, while the phase noise included in the optical signal from the optical modulator is represented by $\Delta v2$ in FIG. 27B.

The angle-modulated signal obtained as the beat signal of these two lightwaves has, as shown in FIG. 27C, phase noise equal to the sum of the phase noises of the two lightwaves ($\Delta v1 + \Delta v2$). The phase noises are simply summed because these lightwaves from the light sources have no interrelationship in phase each other. When the angle-modulated signal is demodulated, the phase noise is also demodulated and becomes large white (intensity) noise. This white noise produces serious deterioration of a demodulated signal in quality.

Further, the conventional angle modulator has to always control and adjust the optical frequencies of the signals from the two light sources (or the difference therebetween). Therefore, the conventional angle modulator requires a control circuit for control and adjustment, for example, resulting in a complicated configuration.

SUMMARY OF THE INVENTION

Therefore, an object of the present invention is to provide an angle modulator capable of realizing extremely high-frequency, wide-band angle modulation through optical signal processing, and suppressing phase noise included in the angle-modulated signal with a simple configuration to improve noise characteristics.

The present invention has the following features to achieve the object above.

The first aspect of the present invention is directed to an angle modulator for converting an input modulating signal into an angle-modulated signal through homodyne detection, comprising:

a light source emitting a light;

an optical branching part branching the light emitted by the light source into a first light and a second light;

an optical intensity modulator performing optical intensity modulation or optical amplitude modulation on the first light with a first electrical signal having a predetermined frequency fc, and outputting an optical-intensity-modulated or optical-amplitude-modulated signal as a first optical signal;

a first optical angle modulator performing optical angle modulation on the second light with a second electrical signal, which is the input modulating signal, and outputting an optical-angle-modulated signal as a second optical signal;

an optical coupler coupling the first and second optical signals; and a photo-detector with a square-law detection characteristic converting an optical signal outputted from the optical coupler into an electrical signal and outputting the electrical signal as the angle-modulated signal having a carrier frequency fc.

In the first aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, thereby down-converting the optical angle modulation spectrum and generating an angle-modulated signal at the frequency fc with the second electrical signal as the original signal. Thus, it is possible to suppress a phase noise component in the light source and achieve wide-band angle modulation with suppressed noise. Moreover, a plurality of light sources are not required, and optical frequency control over such light sources is also not required. Therefore, wide-band angle modulation can be achieved with a simple structure.

According to a second aspect, in the first aspect, the optical intensity modulator performs single-sideband optical intensity modulation or single- sideband optical amplitude modulation.

In the second aspect, in the homodyne structure that subjects two lights from the same light source to optical intensity modulation and optical angle modulation and then carries out square-law detection, single-sideband optical modulation is used as optical intensity modulation (or optical amplitude modulation). Thus, the occurrence of an undesired component other than a desired angle-modulated signal can be prevented, and high-quality angle modulation can be achieved.

According to a third aspect, in the first aspect, the optical intensity modulator performs optical intensity modulation or optical amplitude modulation with an optical carrier suppressed.

In the third aspect, in the homodyne structure that subjects two lights from the same light source to optical intensity modulation and optical angle modulation and then carries out square-law detection, optical carrier suppression modulation is used as optical intensity modulation (or optical amplitude modulation). Thus, the occurrence of an undesired component other than a desired angle-modulated signal can be prevented, and high-quality angle modulation can be achieved.

According to a fourth aspect, in the third aspect, the optical intensity modulator is implemented as a Mach-Zehnder interferometer whose bias voltage is adjusted so as to minimize output light intensity.

In the fourth aspect, in the homodyne structure that subjects two lights from the same light source to optical intensity modulation and optical angle modulation and then carries out square-law detection, a Mach-Zehnder interferometer is used as the optical intensity modulator for carrying out optical intensity modulation (or optical amplitude modulation) with an optical carrier suppressed. The bias voltage of such optical intensity modulator is adjusted so as to minimize the output light intensity. Thus, the occurrence of an undesired component other than a desired angle-modulated signal can be prevented, and high-quality angle modulation can be achieved.

According to a fifth aspect, in the first aspect, the optical intensity modulator performs single-sideband optical intensity modulation or single-sideband optical amplitude modulation with an optical carrier suppressed.

According to a sixth aspect, in the fifth aspect, the optical intensity modulator is implemented as a Mach-Zehnder interferometer whose bias voltage is adjusted so as to minimize output light intensity.

According to a seventh aspect, in the first aspect, optical propagation time in a path from the optical branching part through the optical intensity modulator to the optical coupler is approximately equal to optical propagation time in a path from the optical branching part through the first optical angle modulator to the optical coupler.

In the seventh aspect, the propagation times in a plurality of paths from the optical branching part to the optical coupler are set to be approximately equal to each other to perform efficient optical homodyne detection. Thus, efficient angle modulation with suppressed noise can be achieved with stability.

According to an eighth aspect, in the seventh aspect, the optical intensity modulator is implemented as a Mach-Zehnder interferometer including first and second optical phase modulators, and optical propagation time in a path from the optical branching part through the first optical phase modulator to the optical coupler is equal to optical propagation time in a path from the optical branching part through the second optical phase modulator to the optical coupler.

In the eighth aspect, an optical waveguide constructing the optical intensity modulator of a Mach-Zehnder interferometer is provided, and the propagation times in a plurality of paths from the optical branching part through the optical coupler are set to be equal to each other to perform efficient optical homodyne detection. Thus, efficient angle modulation with suppressed noise can be achieved with stability.

According to a ninth aspect, in the eighth aspect, the optical propagation time in the path from the optical branching part through the first optical phase modulator to the optical coupler, the optical propagation time in the path from the optical branching part through the second optical phase modulator to the optical coupler, and the optical propagation time in the path from the optical branching part through the optical angle modulator to the optical coupler are equal to one another.

According to a tenth aspect, in the seventh aspect, all or part of the optical intensity modulator, the first optical angle modulator, and optical waveguides from the light source through the optical intensity modulator or the first optical angle modulator to the photodetector is formed on a same crystal substrate.

In the tenth aspect, the branching part for branching a light from the light source, optical waveguides for guiding branched lights, and a coupler for coupling these lights again are formed on the same crystal substrate. This structure integrates the optical intensity modulator of a Mach-Zehnder interferometer and the optical angle modulator with high accuracy to ensure stability in optical homodyne detection, thereby enabling efficient optical homodyne detection. Thus, efficient, stable angle modulation with suppressed noise can be achieved.

According to an eleventh aspect, in the first aspect, the angle modulator further comprises:

a controller controlling operating conditions of the optical intensity modulator so as to maximize a level of the angle-modulated signal outputted from the photodetector.

In the eleventh aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-detected with the second electrical signal, thereby down-converting the optical angle modulation spectrum and generating an angle-modulated signal at the frequency fc with the second electrical signal as the original signal. Furthermore, the conditions for optical intensity modulation are adjusted so as to maximize the level of the angle-modulated signal. Thus, it is possible to suppress a phase noise component and achieve efficient angle modulation with suppressed noise.

According to a twelfth aspect, in the eleventh aspect, the optical intensity modulator is implemented as a Mach-Zehnder interferometer, and the controller adjusts a bias voltage of the optical intensity modulator so as to maximize the level of the angle-modulated signal.

In the twelfth aspect, a Mach-Zehnder interferometer is used as the optical intensity modulator, and by adjusting its bias voltage, the optical intensity modulation efficiency is optimally set. Thus, the level of the angle-modulated signal is maximized, and more efficient angle modulation can be achieved.

According to a thirteenth aspect, in the twelfth aspect, the optical intensity modulator is implemented as a push/pull-type Mach-Zehnder interferometer having two electrical signal input terminals that branches the first electrical signal into first and second modulating signals having a predetermined phase relation with each other and supplies the first and second modulating signals to the two electrical signal input terminals, and the controller adjusts a phase difference between the first and second modulating signals so as to maximize the level of the angle-modulated signal.

In the thirteenth aspect, a push/pull-type Mach-Zehnder interferometer having two electrical signal input terminals is used as the optical intensity modulator, and the phase difference between two input electrical signals is adjusted to improve the accuracy of suppressing an optical carrier component. Thus, it is possible to suppress an undesired signal component that occurs in a low-frequency band due to a residual optical carrier component in suppressed-carrier optical intensity modulation, thereby achieving high-quality angle modulation with less waveform distortion.

According to a fourteenth aspect, in the first aspect, the angle modulator further comprises:

a controller controlling operating conditions of the optical intensity modulator so as to minimize a level of a low-frequency component corresponding to the second electrical signal, the low-frequency component being generated in the photo-detector through homodyne detection of the optical-angle-modulated signal and a residual optical carrier component included in the optical-intensity-modulated signal.

In the fourteenth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, thereby down-converting the optical angle modulation spectrum and generating an angle-modulated signal at the frequency fc with the second electrical signal as the original signal. Moreover, the conditions for optical intensity modulation are adjusted so as to minimize an undesired signal component occurring in a low-frequency band due to interference between the residual optical carrier component in suppressed-carrier optical intensity modulation and the optical-angle-modulated signal. Thus, it is possible to achieve high-quality angle modulation with less waveform distortion and noise.

According to a fifteenth aspect, in the fourteenth aspect, the optical intensity modulator is implemented as a Mach-Zehnder interferometer, and the controller adjusts a bias voltage of the optical intensity modulator so as to minimize the level of the low-frequency component.

According to a sixteenth aspect, in the fourteenth aspect, the optical intensity modulator is implemented as a push/pull-type Mach-Zehnder interferometer having two electrical signal input terminals, the first electrical signal is branched into first and second modulating signals having a predetermined phase relation with each other and the first and second modulating signals are supplied to the two electrical signal input terminals, and the controller adjusts a phase difference between the first and second modulating signals so as to minimize the level of the low-frequency component.

According to a seventeenth aspect, in the first aspect, the angle modulator further comprises:

a controller controlling operating conditions of the optical intensity modulator so as to maximize a level of a signal component having a frequency 2fc that is equivalent to a double harmonic of the first electrical signal, the signal component being generated in the photo-detector through homodyne detection of upper-sideband and lower-sideband components included in the optical-intensity-modulated signal.

In the seventeenth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, thereby down-converting the optical angle modulation spectrum and generating an angle-modulated signal at the frequency fc with the second electrical signal as the original signal. Furthermore, the conditions for optical intensity modulation are adjusted so as to maximize a harmonic component occurring due to interference between the upper and lower sideband components in optical intensity modulation with each other. Thus, it is possible to achieve high-quality angle modulation with less waveform distortion and noise.

According to an eighteenth aspect, in the seventeenth aspect, the optical intensity modulator is implemented as a Mach-Zehnder interferometer, and the controller adjusts a bias voltage of the optical intensity modulator so as to maximize the level of the signal component equivalent to the double harmonic of the first electrical signal in level.

According to a nineteenth aspect, in the seventeenth aspect, the optical intensity modulator is implemented as a push/pull-type Mach-Zehnder interferometer having two electrical signal input terminals, the first electrical signal is branched into first and second modulating signals having a predetermined phase relation with each other and the first and second modulating signals are supplied to the two electrical signal input terminals, and the controller adjusts a phase difference between the first and second modulating signals so as to maximize the level of the signal component equivalent to the double harmonic of the first electrical signal.

According to a twentieth aspect, in the first aspect, the angle modulator further comprises:

a controller receiving an optical signal divided from the first optical signal outputted from the optical intensity modulator, converting the optical signal into an electrical signal by the square-law detection characteristic, and controlling operating conditions of the optical intensity modulator so as to minimize a level of a signal component having a frequency fc that is equivalent to the first electrical signal included in the electrical signal.

In the twentieth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, thereby down-converting the optical angle modulation spectrum and generating an angle-modulated signal at the frequency fc with the second electrical signal as the original signal. Moreover, part of the optical-intensity-modulated signal is divided and square-law-detected, and in the detection output, the conditions for the optical intensity modulation are adjusted so as to minimize the component occurring at the frequency fc. Thus, it is possible to achieve high-quality angle modulation with less waveform distortion and noise.

According to a twenty-first aspect, in the twentieth aspect, the optical intensity modulator is implemented as a Mach-Zehnder interferometer, and the controller adjusts a bias voltage of the optical intensity modulator so as to minimize the level of the signal component equivalent to the first electrical signal.

In the twenty-first aspect, a push/pull-type Mach-Zehnder interferometer having two electrical signal input terminals is used as the optical intensity modulator, and its bias voltage is adjusted to improve the accuracy of suppressing an optical carrier component. Thus, it is possible to suppress a residual optical carrier component in suppressed-carrier optical intensity modulation, thereby achieving high-quality angle modulation with less waveform distortion.

According to a twenty-second aspect, in the twentieth aspect, the optical intensity modulator is implemented as a push/pull-type Mach-Zehnder interferometer having two electrical signal input terminals, the first electrical signal is branched into first and second modulating signals having a predetermined phase relation with each other and the first and second modulating signals are supplied to the two electrical signal input terminals, and the controller adjusts a phase difference between the first and second modulating signals so as to minimize the level of the signal component equivalent to the first electrical signal.

According to a twenty-third aspect, in the first aspect, the angle modulator further comprises:

a controller receiving an optical signal divided from the first optical signal outputted from the optical intensity modulator, converting the optical signal into an electrical signal by a square-law detection characteristic, and controlling operating conditions of the optical intensity modulator so as to maximize a level of a signal component having a frequency 2fc that is equivalent to a double harmonic of the first electrical signal included in the electrical signal.

In the twenty-third aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, thereby down-converting the optical angle modulation spectrum and generating an angle-modulated signal at the frequency fc with the second electrical signal as the original signal. Moreover, part of the optical-intensity-modulated signal is divided and square-law-detected, and in the detection output, the conditions for the optical intensity modulation are adjusted so as to maximize the component occurring at the frequency 2fc. Thus, it is possible to achieve high-quality angle modulation with less waveform distortion and noise.

According to a twenty-fourth aspect, in the twenty-third aspect, the optical intensity modulator is implemented as a Mach-Zehnder interferometer, and the controller adjusts a bias voltage of the optical intensity modulator so as to maximize the level of the signal component equivalent to the double harmonic of the first electrical signal.

According to a twenty-fifth aspect, in the twenty-third aspect, the optical intensity modulator is implemented as a push/pull-type Mach-Zehnder interferometer having two electrical signal input terminals, the first electrical signal is branched into first and second modulating signals having a predetermined phase relation with each other and the first and second modulating signals are supplied to the two electrical signal input terminals, and the controller adjusts a phase difference between the first and second modulating signals so as to maximize the level of the signal component equivalent to the double harmonic of the first electrical signal.

According to a twenty-sixth aspect, in the seventh aspect, a bias voltage of the first optical angle modulator is adjusted to equalize the optical propagation time in the path from the optical branching part through the optical intensity modulator to the optical coupler and the optical propagation time in the path from the optical branching part through the first optical angle modulator to the optical coupler.

In the twenty-sixth aspect, in the homodyne structure that subjects two lights from the same light source to optical intensity modulation and optical angle modulation and then carries out square-law detection, the bias voltage of the optical angle modulator is adjusted so that the propagation delay amounts of the branched lights are equalized to each other. Thus, it is possible to more accurately suppress a phase noise component included in the light source and achieve wide-band angle modulation with suppressed noise.

According to a twenty-seventh aspect, in the seventh aspect, the angle modulator further comprises:

an optical delay adjuster, inserted in one or both of the paths, for equalizing the optical propagation time in the path from the optical branching part through the optical intensity modulator to the optical coupler and the optical propagation time in the path from the optical branching part through the first optical angle modulator to the optical coupler.

In the twenty-seventh aspect, in the homodyne structure that subjects two lights from the same light source to optical intensity modulation and optical angle modulation and then carries out square-law detection, an optical delay adjuster for adjusting the propagation amounts of the branched lights is inserted in anywhere on the propagation paths. Thus, it is possible to more accurately suppress a phase noise component included in the light source and achieve wide-band angle modulation with suppressed noise.

According to a twenty-eighth aspect, in the first aspect, the optical branching part branches the light emitted by the source into the first light, the second light, and a third light;

the optical coupler couples the first light, second light, and third light; and the angle modulator further comprises an optical carrier propagation part adjusting optical power and an optical propagation delay amount of the third light so that an optical carrier component included in the first optical signal outputted from the optical intensity modulator is suppressed in the optical coupler.

In the twenty-eighth aspect, in the homodyne structure that subjects two lights from the same light source to optical intensity modulation and optical angle modulation and then carries out square-law detection, one additional optical propagation path is further provided, and the carrier component of the optical signal outputted from the optical intensity modulator is cancelled out with the light propagating this additional optical propagation path. Thus, the occurrence of an undesired component other than a desired angle-modulated signal can be prevented, and high-quality angle modulation can be achieved.

According to a twenty-ninth aspect, in the twenty-eighth aspect, the optical carrier propagation part includes an optical phase adjuster adjusting the propagation delay amount of the third light to be in counter phase with the first optical signal; and an optical intensity adjuster adjusting the power of the third light to become equal to power of the optical carrier component included in the first optical signal.

According to a thirty aspect, in the first aspect, the angle modulator further comprises:

one or more optical amplifiers, inserted in any of propagation paths from the light source through the photodetector, optical-amplifying light on the propagation paths.

In the thirty aspect, in the homodyne structure that subjects two lights from the same light source to optical intensity modulation and optical angle modulation and then carries out square-law detection, one additional optical propagation path is further provided, the optical signal to be supplied to the optical detector is optical-amplified to increase the level thereof. Thus, the output signal level of the angle-modulated signal is increased, and high-quality angle modulation can be achieved.

According to a thirty-first aspect, in the first aspect, the angle modulator further comprises:

a filter receiving the electrical signal outputted from the photo-detector and passing only an angle-modulated signal component having the carrier frequency fc.

In the thirty-first aspect, in the homodyne structure that subjects two lights from the same light source to optical intensity modulation and optical angle modulation and then carries out square-law detection, passing of frequency is carried out so that only the desired angle-modulated signal is outputted from the optical detector. Thus, the occurrence of an undesired component other than a desired angle-modulated signal can be prevented, and high-quality angle modulation can be achieved.

According to a thirty-second aspect, in the first aspect, the angle modulator further comprises:

a branching part branching the second electrical signal into two; and a second optical angle modulator performing optical-angle-modulation on the second optical signal outputted from the first optical angle modulator with one branched second electrical signal by the branching part, wherein the first optical angle modulator performs optical angle modulation with a remaining branched second electrical signal.

In the thirty-second aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal, and further one second electrical signal is optical-angle-modulated with the other branched signal, thereby down-converting the optical angle modulation spectrum and generating an angle-modulated signal at the frequency fc with the second electrical signal as the original signal. Thus, it is possible to improve the angle modulation efficiency and realize angle modulation with low noise in a simple structure.

According to a thirty-third aspect, in the thirty-second aspect, propagation time required for the one branched second electrical signal from the branching part to reach the second optical angle modulator is equal to propagation time for the remaining branched second electrical signal from the branching part to reach the second optical angle modulator through the first optical angle modulator.

According to a thirty-fourth aspect, in the thirty-third aspect, the angle modulator further comprises:

a delay adjuster, inserted in one or both of a signal path from the branching part to the first optical angle modulator and a signal path from the branching part to the second optical angle modulator, for equalizing the propagation time required for the one branched second electrical signal from the branching part to reach the second optical angle modulator and the propagation time for the remaining branched second electrical signal from the branching part to reach the second optical angle modulator through the first optical angle modulator.

According to a thirty-fifth aspect, in the first aspect, the angle modulator further comprises:

a band divider dividing a frequency band of the second electrical signal into two; and a second optical angle modulator performing optical angle modulation on the second optical signal outputted from the first optical angle modulator with one band-divided second electrical signal from the band divider, wherein the first optical angle modulator performs optical angle modulation with a remaining band-divided second electrical signal from the band divider.

In the thirty-fifth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with one signal obtained by band-dividing the second electrical signal, and further the second electrical signal is optical-angle-modulated with the other signal obtained by band-dividing the second electrical signal, thereby down-converting the optical angle modulation spectrum and generating an angle-modulated signal at the frequency fc with the second electrical signal as the original signal. Thus, it is possible to further improve the angle modulation efficiency and realize wide-band angle modulation with low noise in a simple structure.

According to a thirty-sixth aspect, in the first aspect, the angle modulator further comprises:

a counter phase branching part branching the second electrical signal into two branched second electrical signals in counter phases to each other; and a third optical angle modulator performing optical angle modulation on the first optical signal outputted from the optical intensity modulator with one branched second electrical signal from the counter phase branching part, wherein the first optical angle modulator performs optical angle modulation with a remaining branched second electrical signal from the counter phase branching part.

In the thirty-sixth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with one signal obtained by counter phase-branching the second electrical signal, thereby down-converting the optical angle modulation spectrum and generating an angle-modulated signal at the frequency fc with the second electrical signal as the original signal. Thus, it is possible to improve the angle modulation efficiency and realize wide-band angle modulation with low noise in a simple structure.

According to a thirty-seventh aspect, in the thirty-sixth aspect, propagation time required for the one branched second electrical signal from the counter phase branching part to reach the optical coupler through the third optical angle modulator is equal to propagation time for the remaining branched second electrical signal from the counter phase branching part to reach the optical coupler through the first optical angle modulator.

According to a thirty-eighth aspect, in the thirty-seventh aspect, a delay adjuster, inserted in one or both of a signal path from the counter phase branching part to the first optical angle modulator and a signal path from the counter phase branching part to the third optical angle modulator, for equalizing the propagation time required for the one branched second electrical signal from the counter phase branching part to reach the optical coupler through the third optical angle modulator and the propagation time for the remaining branched second electrical signal from the counter phase branching part to reach the optical coupler through the first optical angle modulator.

According to a thirty-ninth aspect, in the first aspect, the angle modulator further comprises:

a band divider dividing a frequency band of the second electrical signal into two; and a third optical angle modulator performing optical angle modulation on the first optical signal outputted from the optical angle modulator with one band-divided second electrical signal from the band divider, wherein the first optical angle modulator performs optical angle modulation with a remaining band-divided second electrical signal from the band divider.

In the thirty-ninth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with one signal obtained by band-dividing the second electrical signal, and further the second electrical signal is optical-angle-modulated with the other signal obtained by band-dividing the second electrical signal, thereby down-converting the optical angle modulation spectrum and generating an angle-modulated signal at the frequency fc with the second electrical signal as the original signal. Thus, it is possible to improve the angle modulation efficiency and realize wide-band angle modulation with low noise in a simple structure.

According to a fortieth aspect, in the first aspect, the angle modulator further comprises:

a second optical modulator performing optical angle modulation on the second optical signal outputted from the first optical angle modulator with a third electrical signal, wherein the third electrical signal is the modulating signal that is different in frequency band from the second electrical signal.

In the fortieth aspect, in the homodyne structure that subjects two lights from the same light source to optical intensity modulation and optical angle modulation and then carries out square-law detection, one branched light is optical-intensity-modulated with the first electrical signal having the frequency fc, while the other is optical-angle-modulated with the second electrical signal and then further with the third electrical signal, thereby down-converting the optical angle modulation spectrum and generating an angle-modulated signal at the frequency fc with the second and third electrical signals as the original signals. Thus, it is possible to improve the angle modulation efficiency and realize wide-band angle modulation with low noise in a simple structure.

According to a forty-first aspect, in the first aspect, the angle modulator further comprises:

a third optical modulator performing optical angle modulation on the first optical signal outputted from the optical intensity modulator with a third electrical signal, wherein the third electrical signal is the modulating signal that is different in frequency band from the second electrical signal.

In the forty-first aspect, in the homodyne structure that subjects two lights from the same light source to optical intensity modulation and optical angle modulation and then carries out square-law detection, one branched light is optical-intensity-modulated with the first electrical signal having the frequency fc and then further with the third electrical signal, while the other is optical-angle-detected with the second electrical signal, thereby down-converting the optical angle modulation spectrum and generating an angle-modulated signal at the frequency fc with the second and third electrical signals as the original signals. Thus, it is possible to improve the angle modulation efficiency and realize wide-band angle modulation with low noise in a simple structure.

A forty-second aspect is directed to an angle modulator for converting an input modulating signal into an angle-modulated signal through homodyne detection, comprising:

a light source emitting a light;

an optical branching part branching the light emitted by the source into a first light and a second light;

an optical frequency shifter performing frequency conversion or frequency shifting of an optical frequency of the first light for a predetermined amount fc, and outputting as a first optical signal;

an optical angle modulator performing optical angle modulation on the second light with the input modulating signal, and outputting an optical-angle-modulated signal as a second optical signal;

an optical coupler coupling the first and second optical signals; and a photo-detector with a square-law detection characteristic converting an optical signal outputted from the optical coupler into an electrical signal and outputting the electrical signal as the angle-modulated signal having a carrier frequency fc.

In the forty-second aspect, in the homodyne structure that subjects one of the two lights emitted from the same light source to optical frequency conversion or optical frequency shifting, subjects the other to optical angle modulation with the second electrical signal as the original signal, and then carries out square-law detection, the optical angle modulation spectrum is down-converted, and an angle-modulated signal at the frequency fc is generated with the second electrical signal as the original signal. Thus, by suppressing a phase component in the light source and preventing the occurrence of an undesired component other than a desired angle-modulated signal, high-quality angle modulation can be achieved.

A forty-third aspect is directed to a method f or converting an input modulating signal into an angle-modulated signal through homodyne detection, comprising the steps of:

branching light emitted by a light source into a first light and a second light;

generating a first optical signal including a signal component of an optical frequency shifted from an optical frequency of the first light for a predetermined amount fc;

generating a second optical signal through optical angle modulation on the second light with the input modulating signal;

coupling the first optical signal and the second optical signal; and converting the coupled optical signals into an electrical signal through homodyne detection and outputting the angle-modulated signal having a carrier frequency fc.

In the forty-third aspect, in the optical homodyne system that branches a light emitted from a single light source into two, combines the two lights again, and then carries out square-law detection, the two branched lights are subjected to optical intensity modulation (or optical amplitude modulation) and optical angle modulation (optical frequency modulation or optical phase modulation), thereby generating a beat signal between the two optical signals and down-converting the optical angle modulation spectrum. Thus, a phase noise component in the light source is cancelled out, and wide-band angle modulation with low noise can be achieved.

BRIEF DESCRIPTION OF THE DRAWINGS

FIG. 7 is a block diagram showing the configuration of an angle modulator according to a second embodiment of the present invention;

FIG. 15 is a block diagram showing the configuration of an angle modulator according to a sixth embodiment of the present invention;

FIG. 16 is a schematic diagram of a frequency spectrum of a second harmonic component occurring at a frequency 2×fc in an electrical signal outputted from the photo-detector 107;

FIG. 17 is a block diagram showing the configuration of an angle modulator according to a seventh embodiment of the present invention;

DESCRIPTION OF THE PREFERRED EMBODIMENTS

First Embodiment

Figure 1:
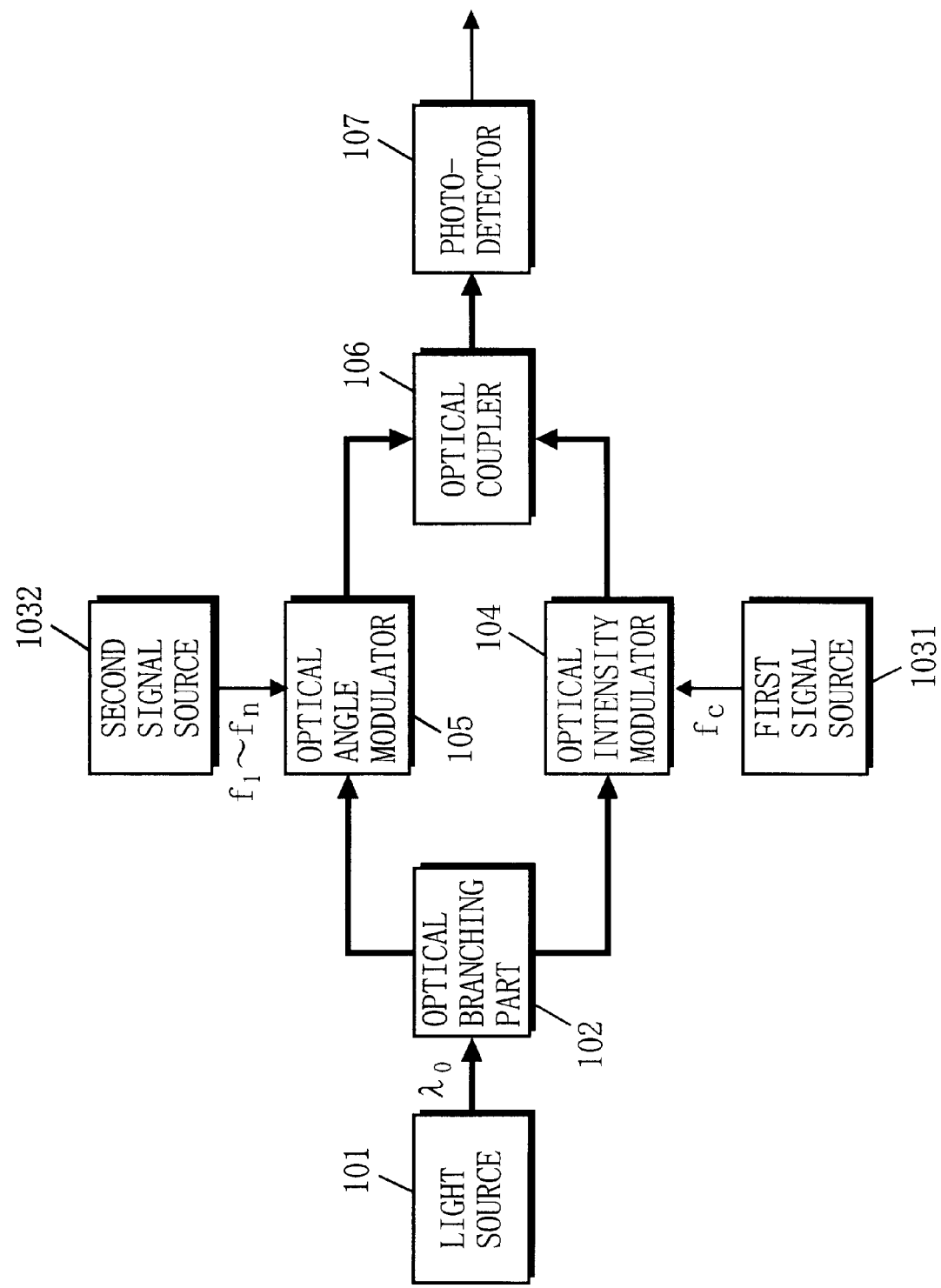
FIG. 1 is a block diagram showing the configuration of an angle modulator according to a first embodiment of the present invention.

Described below is an angle modulation apparatus according to a first embodiment of the present invention with reference to FIG. 1. In FIG. 1, the frequency modulation apparatus includes a signal source 101, an optical branching circuit 102, first and second light sources 1031 and 1032, an optical intensity modulator 104, an optical angle modulator 105, an optical coupler 106, and a photo-detector 107.

The operation of the angle modulator is now described. The optical branching part 102 branches an unmodulated light emitted from the light source 101 into a first light and a second light. The first light is supplied to the optical intensity modulator 104. The optical intensity modulator 104 subjects the input first light to optical intensity modulation (or optical amplitude modulation) based on the amplitude of a first electrical signal having a predetermined frequency fc from the first signal source 1031, and then produces a first optical signal.

The second light is supplied to the optical angle modulator 105. The optical angle modulator 105 subjects the input second light to optical angle modulation (optical phase modulation or optical frequency modulation) according to the amplitude of a second electrical signal from the second signal source 1032, and then produces a second optical signal. The optical coupler 106 couples the first optical signal from the optical intensity modulator 104 and the second optical signal from the optical angle modulator 105 for output.

The photo-detector 107 is constructed of a photo diode having square-law detection characteristics, for example. Therefore, the photo-detector 107 performs homodyne detection of the first and second optical signals from the optical coupler 106 with the square-law detection characteristics, and generates a beat signal based on the frequency difference between these signals for output. The beat signal is an angle-modulated signal obtained by down-converting the second optical signal from the optical angle modulator 105, and its center frequency is fc.

Figure 2A:
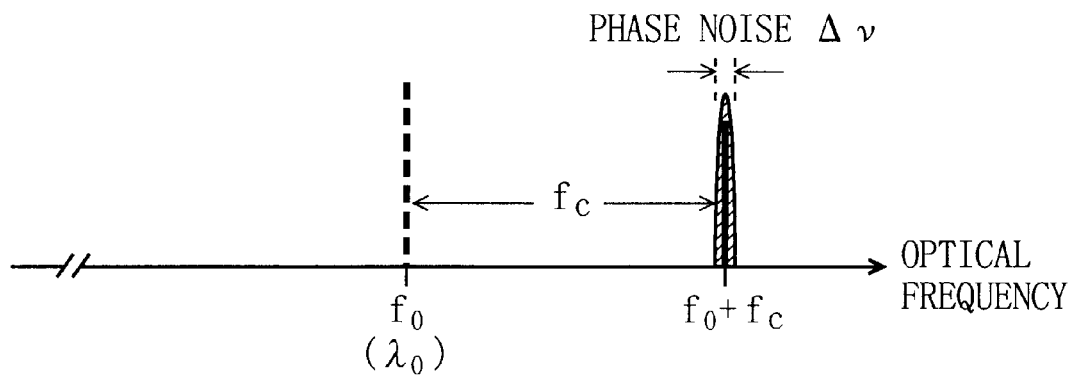
FIG. 2A is a schematic diagram illustrating one example of an optical spectrum of a first optical signal outputted from an optical intensity modulator 104.

In the beat signal generated in the above described manner, phase noise is suppressed. The phase noise is fluctuations in frequency. The effect of phase noise suppression is now described using FIGS. 2A to 2C. FIG. 2A is a schematic diagram illustrating one example of an optical spectrum of the first optical signal outputted from the optical intensity modulator 104. In FIG. 2A, the first optical signal is a single-sideband optical-modulated signal whose original signal is a first electrical signal having the predetermined frequency fc, with the optical carrier suppressed. The detailed operation of the optical intensity modulator 104 for generating such first optical signal will be described later. The first optical signal has the same phase noise Δυ as that of the light emitted from the light source 101.

Figure 2B:
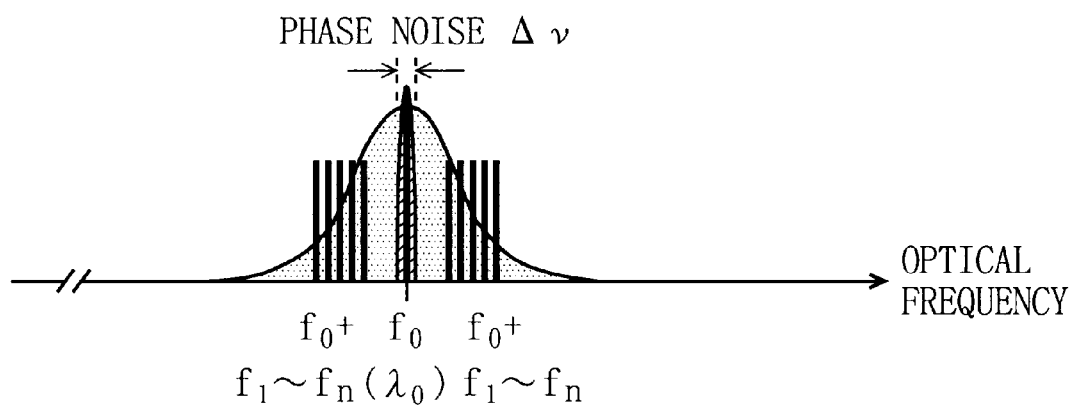
FIG. 2B is a schematic diagram illustrating one example of an optical spectrum of a second optical signal outputted from an optical angle modulator 105.

FIG. 2B is a schematic diagram illustrating one example of an optical spectrum of the second optical signal outputted from the optical angle modulator 105. In FIG. 2B, the second optical signal is an optical-angle-modulated signal whose original signal is the second electrical signal. Here, assume that the second electrical signal is a frequency-multiplexed signal within a band of frequencies f1 to fn, for example. The second optical signal also has the same phase noise Δυ as that in the light source 101.

Figure 2C:
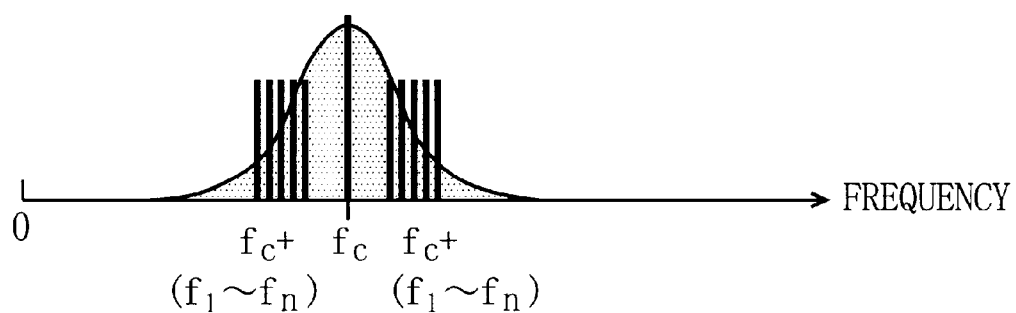
FIG. 2C is a schematic diagram illustrating one example of an optical spectrum of a beat component between the first and second optical signals.

As stated above, the first and second optical signals are square-detected by the photo-detector 107 to generate a beat signal. FIG. 2C is a schematic diagram illustrating one example of an optical spectrum of the beat signal. The beat signal is an angle-modulated signal whose original signal is the second electrical signal, and generated to have the center frequency fc.

Here, the first and second optical signals have the same phase noise Δυ as that of the light emitted from the light source 101. Therefore, in the angle-modulated signal, which is a beat signal between these optical signals, the phase noise is cancelled out. That is, even if the frequency of the first optical signal fluctuates, the frequency of the second optical signal also fluctuates in exactly the same manner. The frequency difference between these signals is thus always constant, independent of fluctuations in frequency. Therefore, according to the angle modulator, an angle-modulated signal with suppressed noise can be obtained.

Figure 3A:
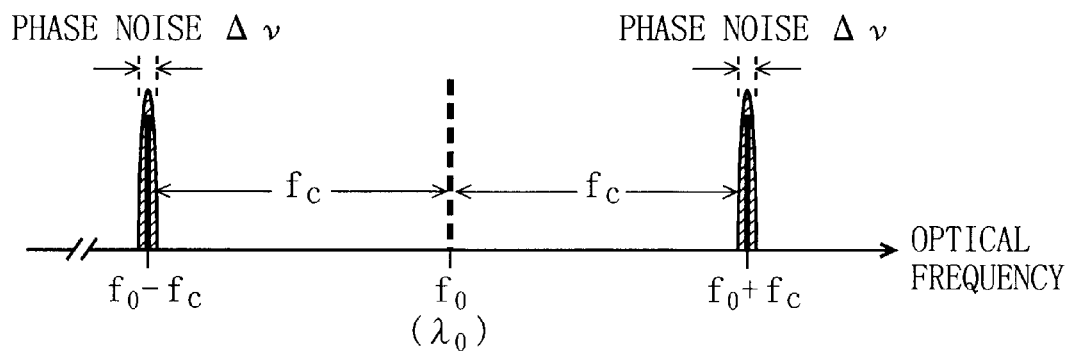
FIG. 3A is a schematic diagram illustrating another example of the optical spectrum of the first optical signal outputted from the optical intensity modulator 104.
Figure 3B:
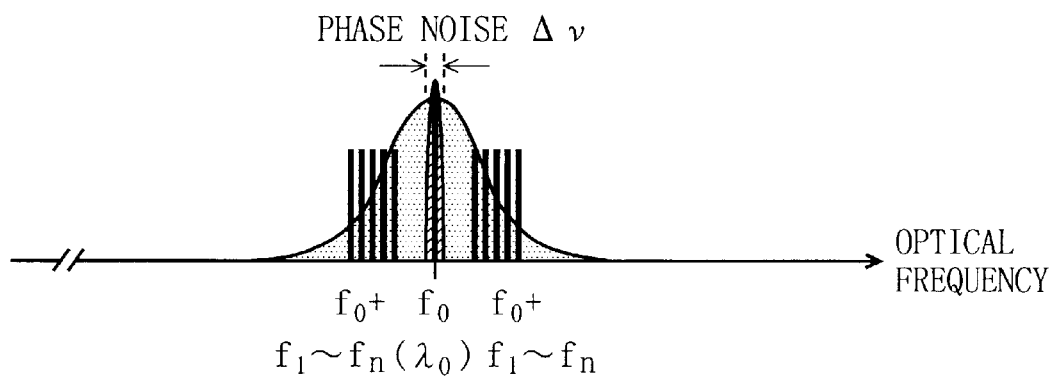
FIG. 3B is a schematic diagram illustrating another example of the optical spectrum of the second optical signal outputted from the optical angle modulator 105.
Figure 3C:
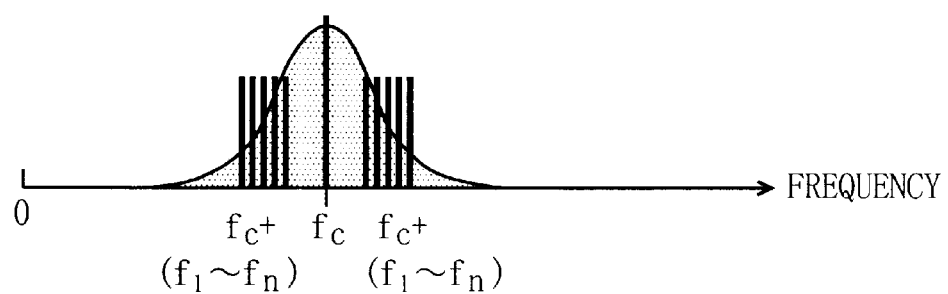
FIG. 3C is a schematic diagram illustrating another example of the optical spectrum of the beat component between the first and second optical signals.

Another example of the phase noise suppression effects is described using FIGS. 3A to 3C. FIG. 3A is a schematic diagram illustrating another example of the optical spectrum of the first optical signal outputted from the optical intensity modulator 104. In FIG. 3A, the first optical signal is a double-sideband optical-modulated signal whose original signal is a first electrical signal having the predetermined frequency fc, with an optical carrier suppressed. The detailed operation of the optical intensity modulator 104 for generating such first optical signal will be described later. The first optical signal has the same phase noise Δυ in both of upper and lower sidebands as that in the light source 101.

FIG. 3B is a schematic diagram illustrating one example of an optical spectrum of the second optical signal outputted from the optical intensity modulator 105. The second optical signal in FIG. 3B is an optical-angle-modulated signal similar to the second optical signal in FIG. 2B. The first and second optical signals have the same phase noise Δυ as that in the light source 101. Therefore, in the angle-modulated signal outputted from the photo-detector 107 as the beat component, the phase noise is cancelled out as described above. FIG. 3C is a schematic diagram illustrating one example of a frequency spectrum of the beat component. Therefore, according to the angle modulator, an angle-modulated signal with suppressed noise can be obtained.

Figure 4:
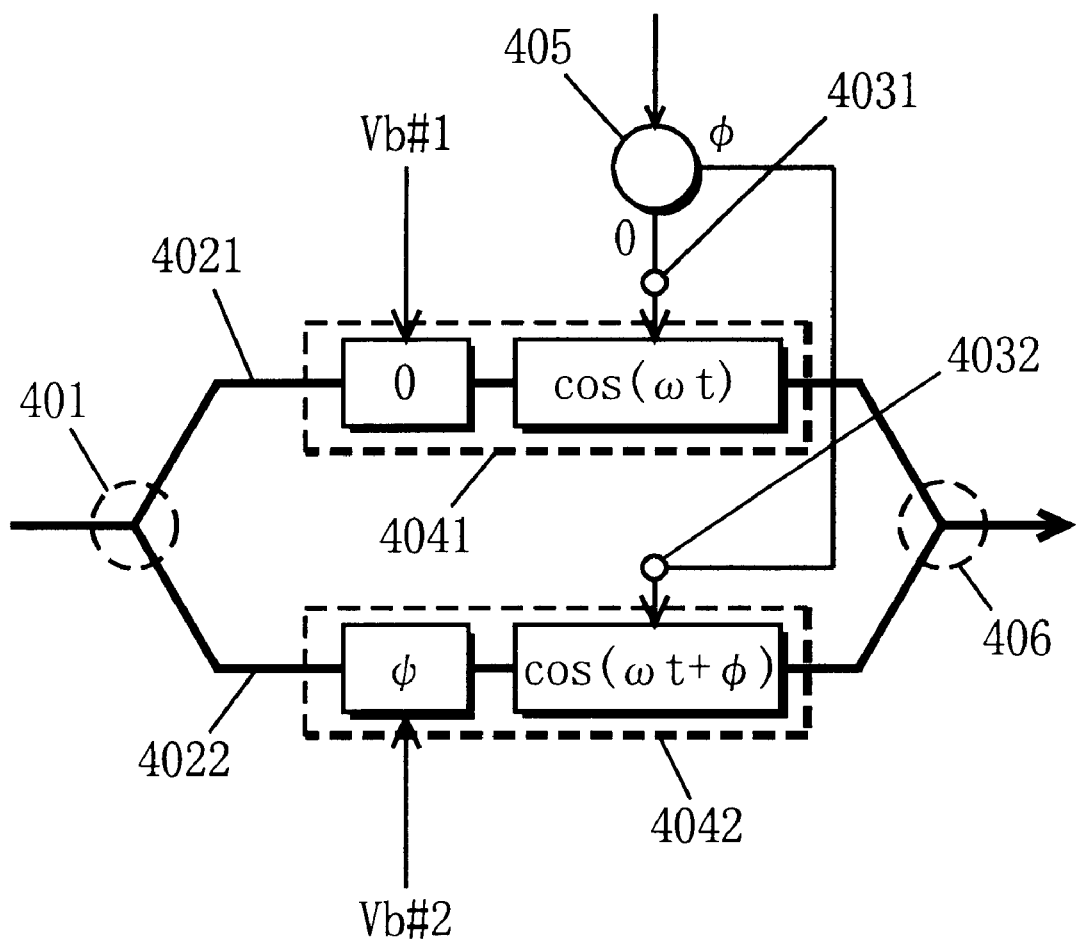
FIG. 4 is a schematic diagram showing the configuration of an optical modulator implemented as a push/pull-type Mach-Zehnder interferometer having two modulating electrodes.

Next, the operation and structure of the optical intensity modulator 104 are described in detail. For the optical intensity modulator 104, a push/pull Mach-Zehnder interferometer type modulator having two modulating electrodes as shown in FIG. 4 is used, for example. In FIG. 4, a light emitted from the light source to the optical intensity modulator 104 is branched into two by an optical branching part 401. The branched two lights are guided through first and second optical waveguides 4021 and 4022, respectively.

First and second modulating electrodes 4041 and 4042 are provided corresponding to the first and second optical waveguides 4021 and 4022, respectively. These electrodes vary refractive indexes of the first and second optical waveguides 4021 and 4022 with changes in applied voltage. Such varying causes the lights guided through the first and second optical waveguides 4021 and 4042 to be phase-modulated, and as a result, optical-phase-modulated signals are produced. These optical-phase-modulated signals are combined by an optical combining part 406. The combined lights interfere with each other, and the first optical signal subjected to optical intensity modulation (or optical amplitude modulation) is produced.

The voltage applied to the above electrodes consists of, as shown in FIG. 4, bias voltages (Vb#1, Vb#2) and first and second modulating signals. The first and second modulating signals are supplied to the corresponding electrodes through first and second modulating signal input terminals 4031 and 4032.

The first and second modulating signals are generated by branching the first electrical signal received from the first signal source 1031 by a branching part 405. At this time, the branching part 405 sets a phase difference ø between the first and second modulating signals so that two optical-phase-modulated signals become 180° counter phase with each other. Such setting increases the phase difference between the optical-phase-modulated signals. Therefore, the optical modulator implemented as a push/pull Mach-Zehnder interferometer can perform modulation more efficiently.

Further, to obtain double-sideband optical-modulated signal with the optical carrier suppressed as the first optical signal, the bias voltage (Vb#1, Vb#2) are set so that an average phase difference between the optical-phase-modulated signals becomes π. The two optical-phase-modulated signals with their phase relation adjusted are combined by the optical combining part 406, thereby interfering with each other and being converted into a double-sideband optical-modulated signal with the optical carrier suppressed.

The above described method for generating a double-sideband optical-modulated signal with the optical carrier suppressed is described in detail in, for example, "High Capacity Hybrid Fibre-Radio Field Experiments at 60 GHz", Harald Schmuck et al., Microwave Photonics, Technical Digest, December 1996, pp. 65–68, which is incorporated herein by reference.

On the other hand, to obtain single-sideband optical-modulated signal as the first optical signal, the first and second modulating signals are set to have the phase difference π/2 therebetween, that is, one of the phases of these modulating signals leads or lags the other by π/2.

Further, to obtain double-sideband optical-modulated signal with the optical carrier suppressed as the first optical signal, the bias voltage (Vb#1, Vb#2) are set so that an average phase difference between the optical-phase-modulated signals becomes π. The two optical-phase-modulated signals with their phase relation adjusted are combined by the optical combining part 406, thereby interfering with each other and being converted into a double-sideband optical-modulated signal with the optical carrier suppressed.

Further, to obtain double-sideband optical-modulated signal with the optical carrier suppressed as the first optical signal, the bias voltage (Vb#1, Vb#2) are set so that an average phase difference between the optical-phase-modulated signals becomes π/2. The two optical-phase-modulated signals with their phase relation adjusted are combined by the optical combining part 406, thereby interfering with each other and being converted into a single-sideband optical-modulated signal with the optical carrier suppressed.

Detailed description of a method for obtaining a single-sideband optical-modulated signal is made in, for example, "Novel Technique For Generation Of Optical SSB With Carrier Using A Single MZM To Overcome Fiber Chromatic Dispersion", G. H. Smith et al., Microwave Photonics, Post-Deadline Papers Technical Digest, December 1996, pp. 5–8, which is incorporated herein by reference.

Figure 5:
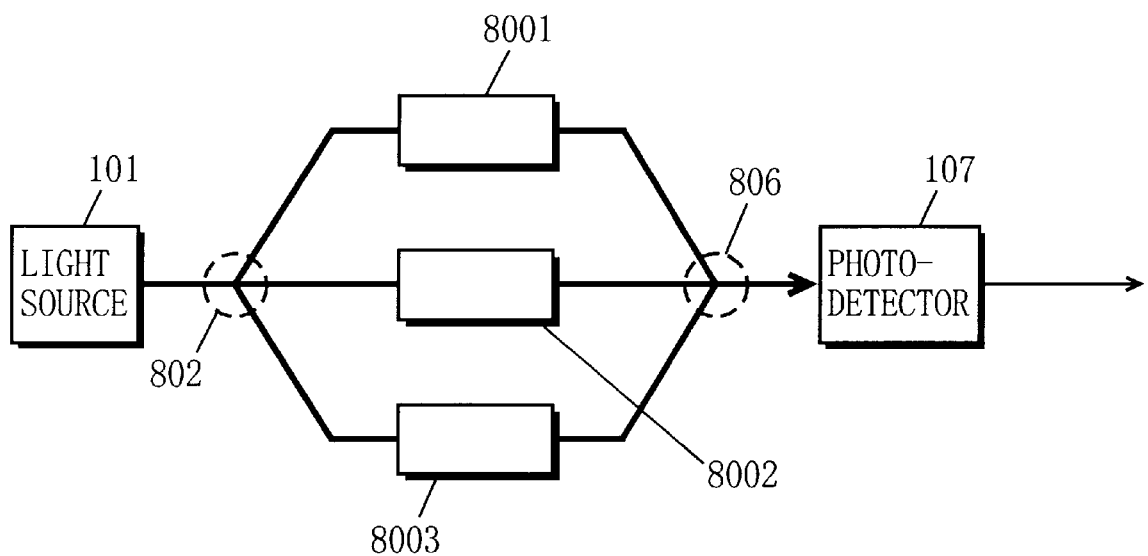
FIG. 5 is a schematic diagram showing one example of the configuration of the angle modulator in which optical devices, optical waveguides, and others from a light source 101 through a photo-detector 107 are formed on the same substrate.
Figure 6:
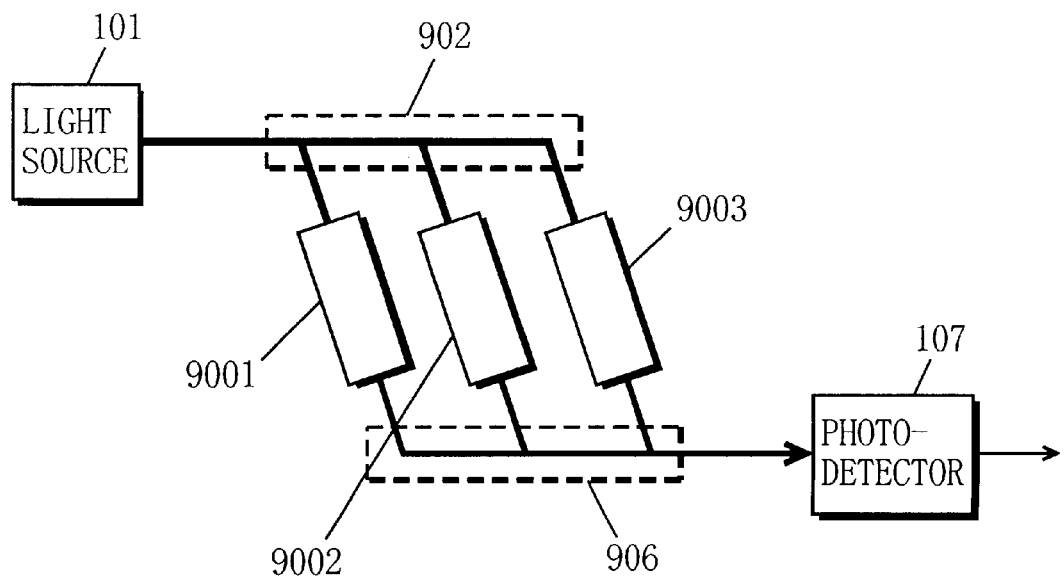
FIG. 6 is a schematic diagram showing another example of the configuration of the angle modulator shown in FIG. 5.

Next, an exemplary structure in which optical devices, optical waveguides, etc. from the light source 101 to the photo-detector 107 are formed on the same substrate is described using FIGS. 5 and 6.

In FIG. 5, the substrate is constructed of crystals, for example, lithium niobate crystals. The substrate includes the light source 101, an optical branching part 802, a first optical modulator 8001, a second optical modulator 8002, a third optical modulator 8003, an optical combining part 806, and the optical detector 107.

Note that, in FIG. 5, the first and third optical modulators 8001 and 8003 form the optical intensity modulator 104 shown in FIG. 1, while the second optical modulator 8002 forms the optical angle modulator 105 shown in FIG. 1. Furthermore, in FIG. 5, the first and second signal sources 1031 and 1032 are not necessarily formed on the same substrate, and therefore not shown herein.

In FIG. 5, the second optical modulator 8002 is on a line between the optical branching part 802 and the optical combining part 806 and arranged approximately at the center on the substrate. The first and third optical modulators 8001 and 8003 are arranged to be symmetric with respect to a line between the optical branching part 802 and the optical combining part 806. Such arrangement equalizes propagation times of the two optical-phase-modulated signals for producing the first optical signal. The reason for such arrangement is described below.

For stable, efficient interference in an optical interferometer, propagation time and polarization of each light must be stabilized. One simplest optical interferometer using optical devices currently available on the market can be constructed by connecting a plurality of optical fibers. In such structure, however, stable optical interference might not be obtained due to shrinkage of the optical fiber length with temperatures, fluctuations in polarization at an optical connector or a fusion splice. Therefore, it is preferable to use the optical intensity modulator implemented as a Mach-Zehnder interferometer that can provide stable optical interference. In this preferable structure, however, propagation times of two optical-phase-modulated signals for producing an optical-intensity-modulated signal have to precisely coincide with each other. Further, for more precise suppression of the phase noise of the angle-modulated signal from the photo-detector 107, propagation time of the optical-intensity-modulated signal and propagation time of the interfering optical-angle-modulated signal are also preferably equalized.

Therefore, in FIG. 5, all paths from the light source 101 through the optical modulator and other components to the photo-detector 107 are formed on the same substrate. This structure can reduce fluctuations in propagation time and polarization of each light signals. Also, propagation times are approximately equalized, thereby enabling stable, efficient optical interfering operation.

Furthermore, the first and third optical modulators 8001 and 8003 are arranged so as to be symmetric with respect to a line. This arrangement enables precise coincidence of the propagation times of the two optical-phase-modulated signals for producing the first optical signal for efficient optical intensity modulation.

Note that, in FIG. 5, some difference occurs between the propagation time via the optical intensity modulator and the propagation time via the optical angle modulator, thereby reducing suppression effect of phase noise in the angle-modulated signal outputted from the photo-detector 107. With each block made small, however, the reduction in suppression effect is prevented at an approval level.

Further, the optical angle modulator 105 varies in propagation delay amount as the bias voltage is changed. Therefore, the bias voltage of the optical angle modulator 105 may be changed in order to equalize the propagation time via the optical intensity modulator and the propagation time via the optical angle modulator.

Next, another structure in which the optical devices and optical waveguides from the light source 101 to the photo-detector 107 in FIG. 1 are formed on the same substrate is described using FIG. 6. In FIG. 6, the substrate includes the light source 101, an optical branching part 902, a first optical modulator 9001, a second optical modulator 9002, a third optical modulator 9003, an optical combining part 906, and the photo-detector 107. The operation of each component in FIG. 6 is similar to that in FIG. 5, except that the optical branching part 902, the first, second, and third optical modulators 9001, 9002, and 9003, and the optical combining part 906 are different in arrangement from the optical branching part 802, the first, second, and third optical modulators 8001, 8002, and 8003, and the optical coupler 806.

Here, as described above, to achieve stable, efficient interference operation in optical interferometers, propagation time and polarization of each light has to be stabilized. Furthermore, to achieve suppression effects of phase noise in the angle-modulated signal more efficiently, it is preferable to precisely coincide the propagation times between the optical-intensity-modulated signal and the optical-angle-modulated signal with each other.

Therefore, as shown in FIG. 6, all paths from the light source 101 through the optical modulators and other components to the photo-detector 107 are formed on the same substrate to reduce the fluctuations in the propagation time and polarization of each optical signal. Further, the optical branching part 902 and the optical combining part 906 are provided with a plurality of branching and points to equalize all propagation times of lights passing through the three paths. Such structure enables equalization of the propagation times of the two optical-phase-modulated signals in the optical intensity modulator as well as the propagation times of the optical-intensity-modulated signal and the optical-angle-modulated signal. Therefore, according to the structure of the present substrate, it is possible to achieve both highly-efficient optical intensity modulation and suppression effects of phase noise in the angle-modulated signal outputted from the photo-detector.

In the above structure, all blocks of optical devices, optical waveguides, and other components from the light source to the photo-detector are formed on the same substrate. Such structure, however, is not necessarily required. Alternatively, according to performance and quality required for angle modulation, these blocks may be separately provided on a plurality of substrates or connected through an optical fiber or the like.

Second Embodiment

FIG. 7 is a block diagram showing the configuration of an angle modulator according to a second embodiment of the present invention. In FIG. 7, the present angle modulator includes the light source 101, the optical branching part 102, the first and second signal sources 1031 and 1032, the optical intensity modulator 104, the optical angle modulator 105, the optical coupler 106, the photo-detector 107, and a controller 108. The present angle modulator is so constructed to further provide the controller 108 for the angle modulator according to the first embodiment. Therefore, the same components are provided with the same reference numerals as those of the first embodiment, and their description is omitted herein. Also, the configuration of the second embodiment is similar to that of the first embodiment in that the optical devices and optical waveguides from the optical source 101 to the photo-detector 107 are formed on the same substrate, and therefore its description is omitted herein. The operation of the controller 108 is described below.

The controller 108 detects the angle-modulated signal supplied by the photo-detector 107 to adjust the operating conditions of the optical intensity modulator 104. In one exemplary method of adjustment (a first method), the controller 108 adjusts the operating conditions of the optical intensity modulator 104 so as to maximize the level of the angle-modulated signal from the photo-detector 107. In another exemplary method of adjustment (a second method), the controller 108 adjusts the operating conditions so as to minimize the level of an undesired component from the photo-detector 107 having a spectrum similar to that of the second electrical signal in a low-frequency band. In still another exemplary method of adjustment (a third method), the controller 108 adjusts the operating conditions so as to maximize the level of a second harmonic of the first electrical signal (hereinafter referred to as 2HD) from the photo-detector 107. First, the first method is described below.

As described above, the optical intensity modulator 104 is typically implemented as a general Mach-Zehnder interferometer. The optical intensity modulator of this type varies in modulation efficiency depending on a bias voltage. Therefore, the controller 108 detects the angle-modulated signal from the photo-detector 107 as shown in FIG. 2C. The controller 108 then optimally adjusts the bias voltage of the optical intensity modulator 104 so as to maximize the level of the angle-modulated signal.

As described above, in the angle modulator according to the first embodiment, it is assumed that the bias voltage of the optical intensity modulator 104 is optimally adjusted in advance. However, changes in various conditions with time possibly cause changes in state from the optimal one. Therefore, the angle modulator according to the second embodiment performs feed-back control by the controller 108 to keep the optimal state in the bias voltage, enabling more efficient angle modulation.

Figure 8A:
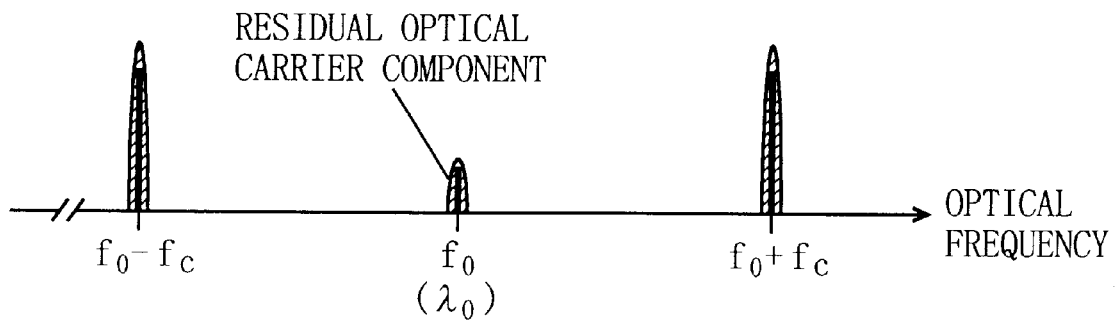
FIG. 8A is a schematic diagram illustrating an optical spectrum of an optical double-side band modulated signal outputted from the optical intensity modulator 104 with a residual optical carrier component included therein.

Next, the second method of adjustment by the controller 108 is described. As described above, the optical intensity modulator 104 cannot, in some cases, actually generate a phase difference between the two optical phase-modulated signals that is theoretically required, due to its setting accuracy. In such cases, the optical carrier component may remain in the optical signal outputted from the optical intensity modulator 104. FIG. 8A is a schematic diagram showing an optical spectrum of the double-sideband optical-modulated signal supplied by the optical intensity modulator 104 with a residual optical carrier component.

Figure 8B:
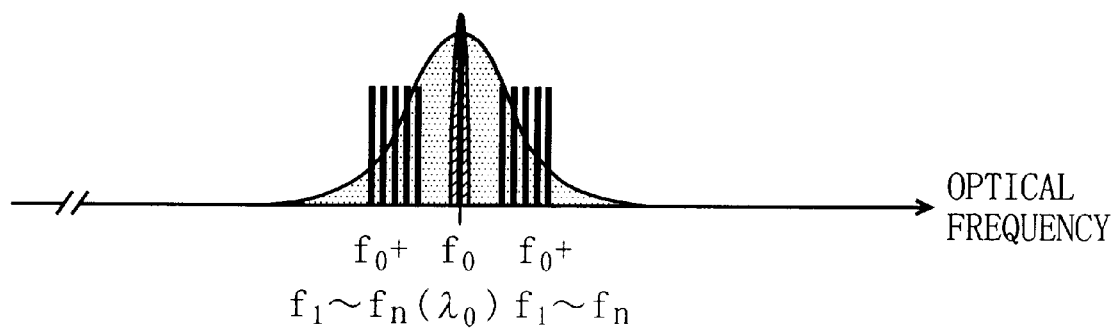
FIG. 8B is a schematic diagram illustrating one example of an optical spectrum of an optical angle-modulated signal outputted from the optical angle modulator 105 in the case of FIG. 8A.

The optical modulated signal is coupled to the optical angle-modulated signal supplied by the optical angle modulator 105. FIG. 8B is a schematic diagram showing an optical spectrum of the optical angle-modulated signal from the optical angle-modulator 105.

Figure 8C:
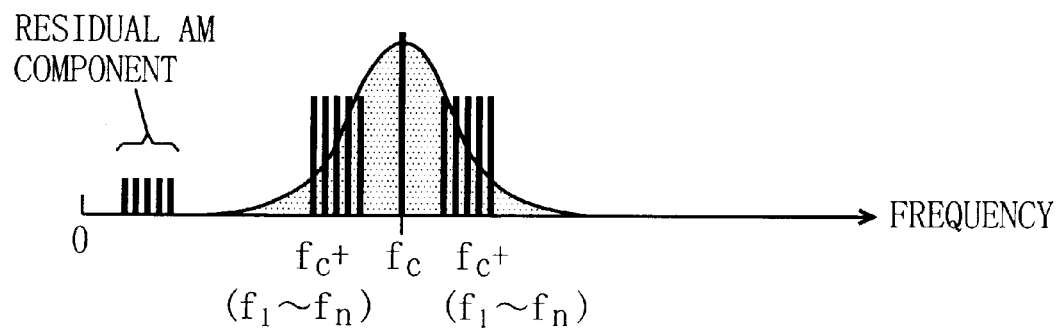
FIG. 8C is a schematic diagram illustrating one example of a frequency spectrum of a signal outputted from the photo-detector 107 in the case of FIG. 8A.

The photo-detector 107 detects the coupled optical signal and also causes interference between the residual optical carrier component and optical angle modulated signal outputted from the optical angle modulator 105 at the same time. Therefore, the signal supplied by the photo-detector 107 includes an undesired component (hereinafter referred to as residual AM component) having a spectrum similar to that of the second electrical signal in the low-frequency band. FIG. 8C is a schematic diagram showing a frequency spectrum of the signal from the photo-detector 107. This residual AM component interferes with the desired angle-modulated signal from the photo-detector 107 to cause deterioration in signal quality.

Therefore, the controller 108 detects the residual AM component from the photo-detector 107, and then adjusts the operating conditions of the optical intensity modulator 104 so as to minimize the level of the residual AM component. With this adjustment, the optical modulator 104 can generate two optical phase-modulated signals having a phase difference closer to that theoretically required. Thus, the present angle modulator can perform more efficient angle modulation.

Note that the above first and second methods of adjustment by the controller 108 have been described assuming that the optical signal supplied by the optical intensity modulator 104 is a double-sideband optical-modulated signal. However, needless to say, the controller 108 can exercise control even if the optical signal is a single-sideband optical-modulated signal.

Figure 9A:
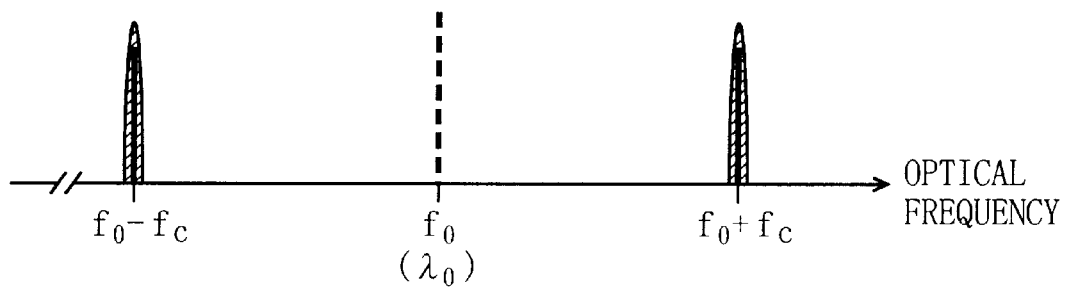
FIG. 9A is a schematic diagram illustrating one example of an optical spectrum of an optical double-sideband modulated signal from the optical intensity modulator 104 with a optical carrier suppressed.
Figure 9B:
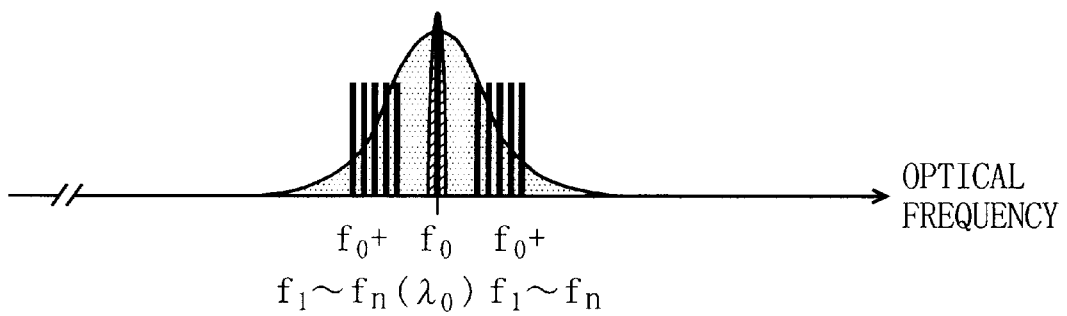
FIG. 9B is a schematic diagram illustrating one example of the optical spectrum of the optical angle-modulated signal outputted from the optical angle modulator 105 in the case of FIG. 9A.
Figure 9C:
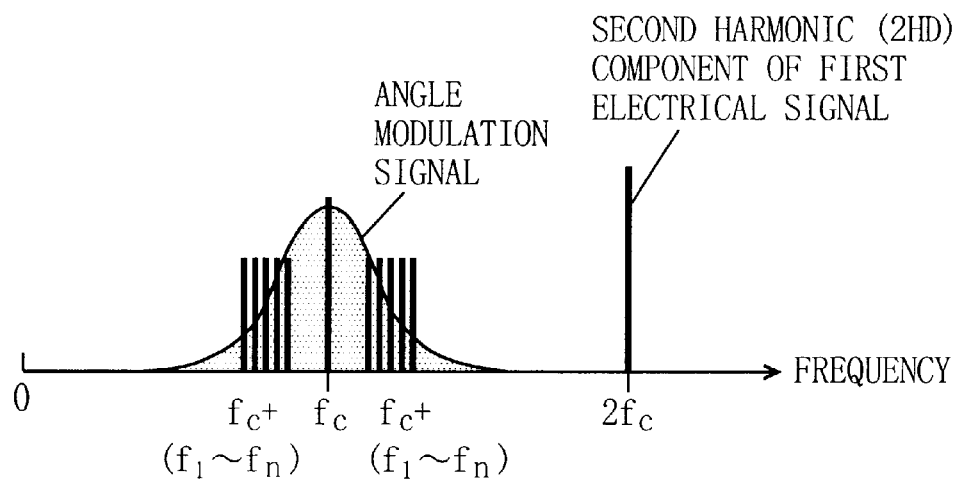
FIG. 9C is a schematic diagram illustrating one example of a frequency spectrum of the signal outputted from the optical detector 107 in the case of FIG. 9A.

Finally, the third method of adjustment by the controller 108 is described. Here, in double-sideband modulation with an optical carrier suppressed by the optical intensity modulator 104, the photo-detector 107 generates a line spectrum component at a frequency (2fc) that is twice as much as the center frequency fc of the angle-modulated signal. This component is a beat component between upper and lower sideband components in the optical-intensity-modulated signal as shown in FIG. 9A. The level of this component is approximately in proportion to the level of the desired angle-modulated signal as shown in FIG. 9B. FIG. 9C is a schematic diagram illustrating a frequency spectrum of the output signal outputted from the photo-detector 107.

The controller 108 detects the 2HD component supplied by the photo-detector 107, and adjusts the operating conditions of the optical intensity modulator 104 so as to maximize the level of the 2HD component. With this adjustment, the optical modulator 104 can generate two optical phase-modulated signals having a phase difference closer to that theoretically required. Thus, the present angle modulator can perform more efficient angle modulation.

As described above, according to the angle modulator of the second embodiment, a light emitted from the light source is branched into two, and then one signal is optical-intensity-modulated and the other is optical-angle-modulated. These two signals are homodyne-detected, and the optical intensity modulation conditions are optimally controlled. With this operation, the angle modulator can efficiently generate an angle-modulated signal with suppressed noise independent of phase noise of the light source or changes of the conditions with time.

Third Embodiment

Figure 10:
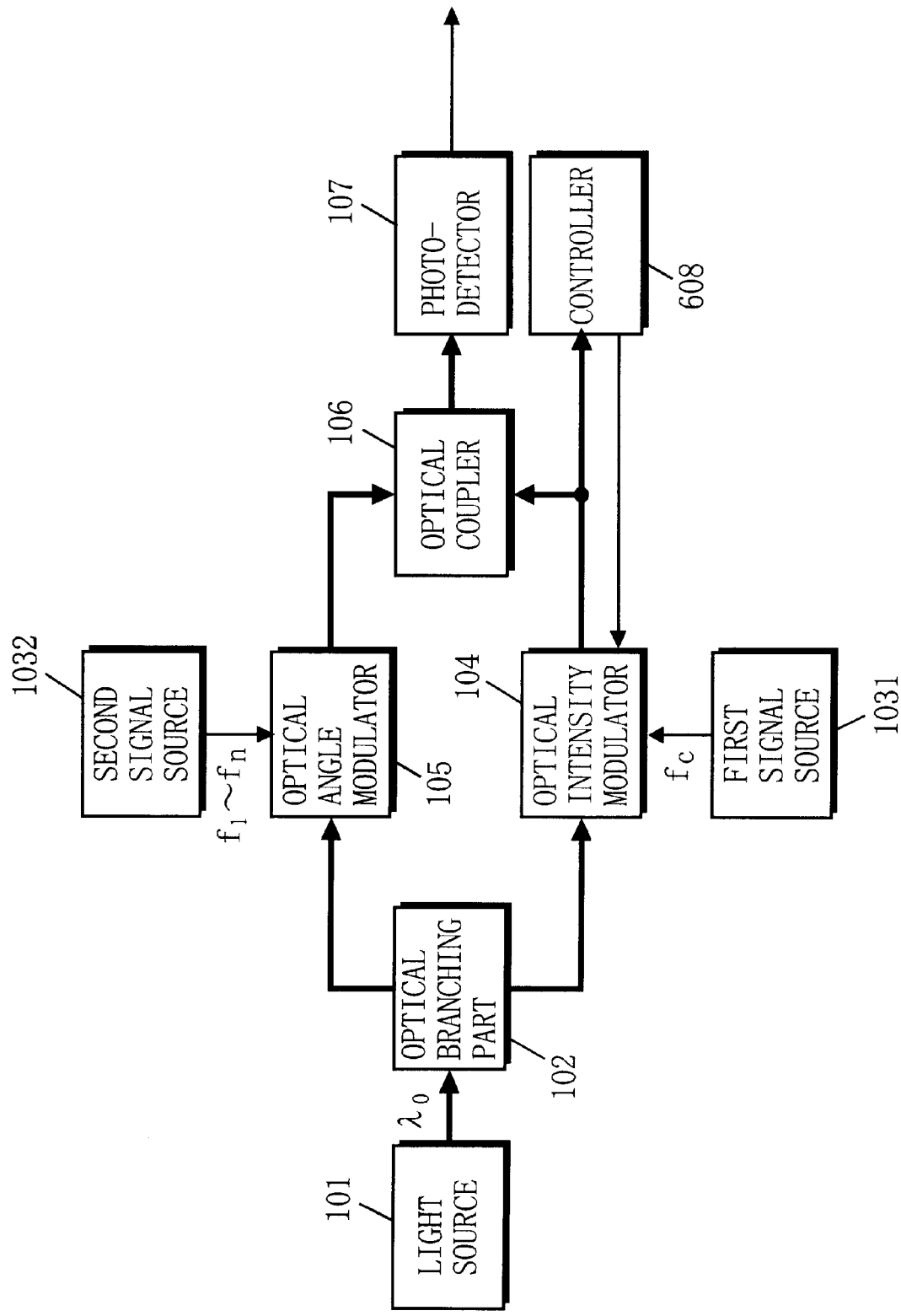
FIG. 10 is a block diagram showing the configuration of an angle modulator according to a third embodiment of the present invention.

FIG. 10 is a block diagram showing the configuration of an angle modulator according to a third embodiment of the present invention. In FIG. 10, the present angle modulator includes the light source 101, the optical branching part 102, the first and second signal sources 1031 and 1032, the optical intensity modulator 104, the optical angle modulator 105, the optical coupler 106, the photo-detector 107, and a controller 608. Compared with the angle modulator according to the second embodiment, the controller 608, which corresponds to the controller 108 of FIG. 7, is inserted in a different position and has a different connecting relation with other components. Therefore, the same components are provided with the same reference numerals as those of the second embodiment, and their description is omitted herein. Also, the configuration of the third embodiment is similar to that of the second embodiment in that the optical devices and optical waveguides from the optical source 101 to the photo-detector 107 are formed on the same substrate, and therefore its description is omitted herein. The operation of the controller 608 is described below.

Part of the optical-intensity-modulated signal from the optical intensity modulator 104 is divided and supplied to the controller 608. The controller 608 performs square-law detection of the supplied optical-intensity-modulated signal. The controller 608 then detects a predetermined line spectrum component from the square-law-detected signal, and adjusts the operating conditions of the optical intensity modulator 104 so as to minimize the level of the line spectrum component.

In one exemplary method of adjustment (a first method), the controller 608 detects the line spectrum component having a frequency fc, and adjusts the operating conditions of the optical intensity modulator 104 so as to minimize the level of the detected component. In another exemplary method of adjustment (a second method), the controller 608 detects the line spectrum component having a frequency 2fc, and adjusts the operating conditions of the optical intensity modulator 104 so as to maximize the level of the detected component. First, the first method is described below.

Figure 11A:
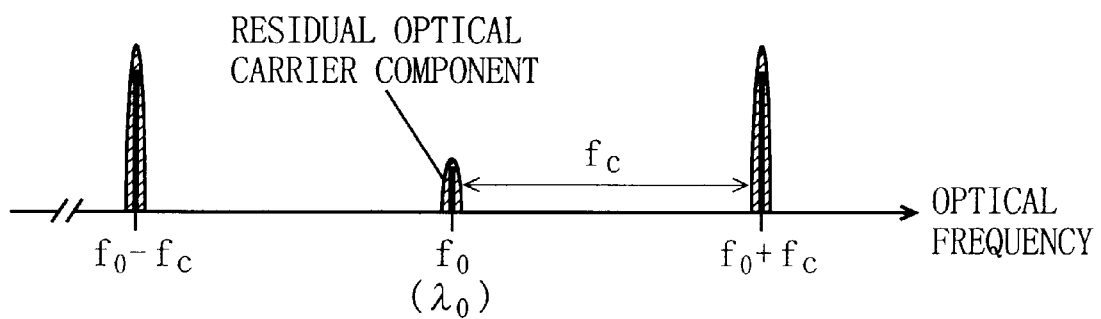
FIG. 11A is a schematic diagram illustrating one example of an optical spectrum of an optical double-sideband modulated signal from the optical intensity modulator 104 with a residual optical carrier component included therein in the third embodiment.
Figure 11B:
FIG. 11B is a schematic diagram illustrating one example of an optical spectrum of a signal square-detected by a controller 608 in the third embodiment.

As stated above, the optical carrier component may remain in the double-sideband suppressed-carrier optical modulated signal outputted from the optical intensity modulator 104. FIG. 11A is a schematic diagram illustrating one example of an optical spectrum of the double-sideband optical modulated signal supplied by the optical intensity modulator 104. Here, the signal square-law-detected by the controller 608 includes a line spectrum at a frequency fc as a beat component between a residual optical carrier component and a sideband component. FIG. 11B is a schematic diagram illustrating one example of an optical spectrum of a signal square-law-detected by the controller 608. As shown in FIG. 11B, since the frequency difference between the residual optical carrier component and the double-sideband component is fc, a line spectrum component is generated at the frequency fc. The same goes for a case where the optical-intensity modulator 104 produces single-sideband suppressed-carrier optical modulated signal.

The level of the line spectrum component at the frequency fc as shown in FIG. 1B is proportional to the level of the residual optical carrier in the optical-intensity-modulated signal. Therefore, the controller 608 detects the line spectrum component, and adjusts the operating conditions of the optical intensity modulator 104 so as to minimize the level of the residual optical carrier. Such adjustment enables the present angle modulator to perform more efficient angle modulation.

Next, the second method of adjustment is described. When the optical intensity modulator 104 produces a double-sideband suppressed-carrier optical modulated signal, as shown in FIG. 11B, the signal square-law-detected by the controller 608 includes the line spectrum component at the frequency fc and also the line spectrum component at the frequency 2fc. This is because upper and lower sideband components of the optical-intensity-modulated signal cause the line spectrum component as a beat component at the frequency 2fc (2HD component), which is equivalent to the frequency difference therebetween.

The level of the line spectrum component at the frequency 2fc as shown in FIG. 11B is inversely proportional to the level of the residual optical carrier in the optical-intensity-modulated signal. Therefore, the controller 608 detects the line spectrum component at the frequency 2fc, and adjusts the operating conditions of the optical intensity modulator 104 to maximize the level of the line spectrum component. Such adjustment enables the present angle modulator to perform more efficient angle modulation.

As described above, in the angle modulator according to the third embodiment, a light emitted from the light source is branched into two, and then one is optical-intensity-modulated while the other is optical-angle-modulated. These obtained two signals are homodyne-detected, and part of the optical-intensity-modulated signal is divided and detected. With this operation, the angle modulator can efficiently generate an angle-modulated signal with suppressed noise with more simple configuration.

Forth Embodiment

Figure 12:
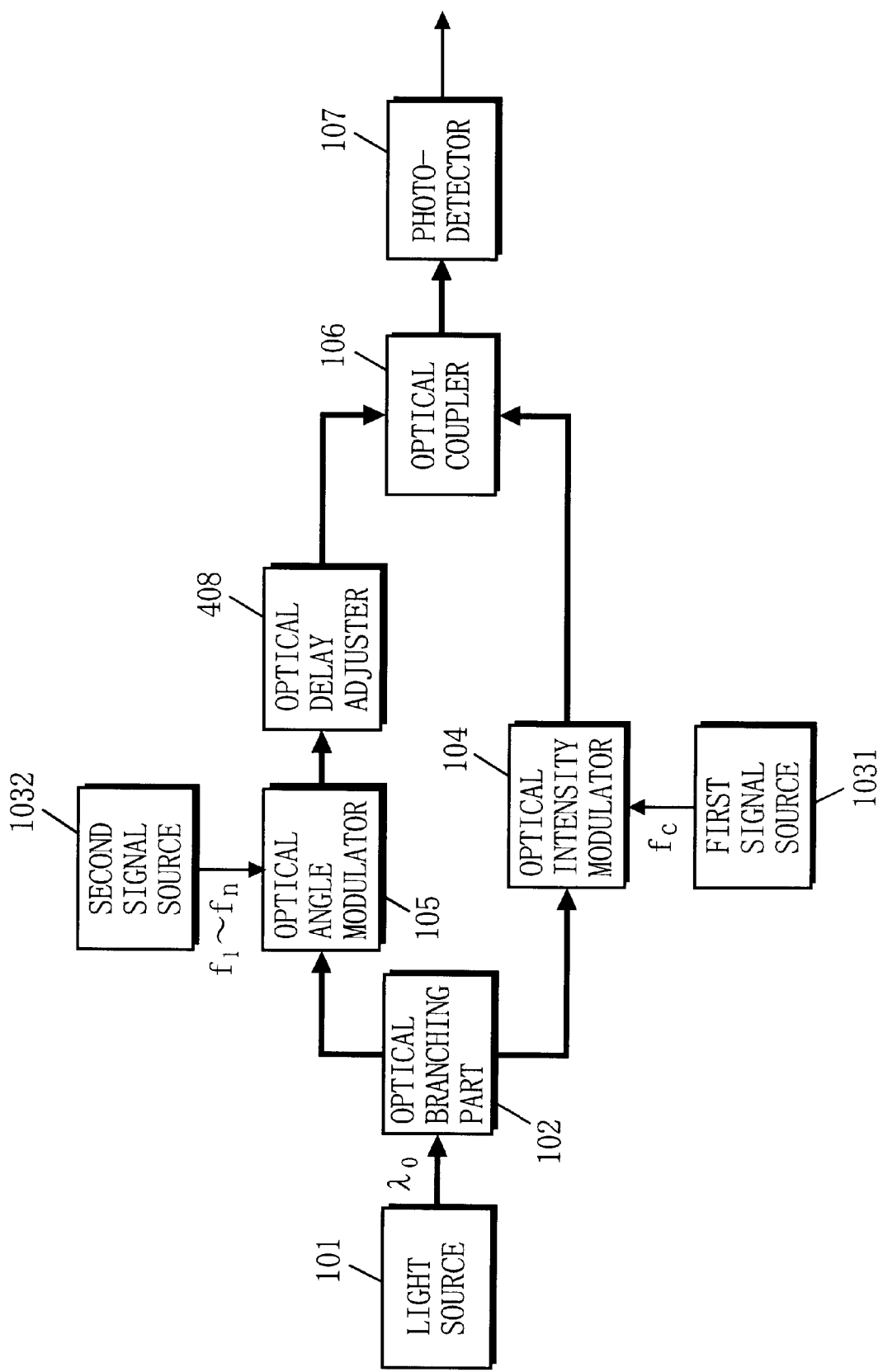
FIG. 12 a block diagram showing the configuration of an angle modulator according to a fourth embodiment of the present invention.

FIG. 12 is a block diagram showing the configuration of an angle modulator according to a fourth embodiment of the present invention. In FIG. 12, the present angle modulator includes the light source 101, the optical branching part 102, the first and second signal sources 1031 and 1032, the optical intensity modulator 104, the optical angle modulator 105, the optical coupler 106, the photo-detector 107, and an optical delay adjuster 408.

The present angle modulator has the configuration similar to that of the angle modulator according to the first embodiment, except that the optical delay adjuster 408 is inserted between the optical angle modulator 105 and the optical coupler 106. Therefore, the same components are provided with the same reference numerals as those in FIG. 1, and their description is omitted herein. Also, the configuration of the fourth embodiment is similar to that of the first embodiment in that the optical devices and optical waveguides from the optical source 101 to the photo-detector 107 are formed on the same substrate, and therefore its description is omitted herein. The operation of the optical delay adjuster 408 is described below.

The optical delay adjuster 408 adjusts the propagation delay amount of the second optical signal outputted from the optical angle modulator 105. This amount is adjusted so as to accurately equalize the propagation delay amounts of the first and second optical signals that are obtained by branching the emitted light into two in the optical branching part 102 and then coupled again in the optical coupler 106. With this adjustment, the phase noise of the angle-modulated signal from the photo-detector 107 can be accurately cancelled out in an ideal state. Therefore, the angle modulator can produce an angle-modulated signal with suppressed noise.

The optical delay adjuster 408 is provided so as to equalize the propagation delay amounts of the first and second optical signals. Therefore, the optical delay adjuster 408 may be inserted in any position on the propagation path of the second optical signal from the optical branching part 102 through the optical coupler 106. The position of the optical delay adjuster 408 in FIG. 12 is just an example only, and may be anywhere on the propagation path of one or both of the first and second optical signals.

Moreover, as described above, the optical intensity modulator 104 cannot, in some cases, actually achieve operating conditions such as a phase difference between the two optical phase-modulated signals that is theoretically required, due to its setting accuracy. Therefore, as in the above second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Fifth Embodiment

Figure 13:
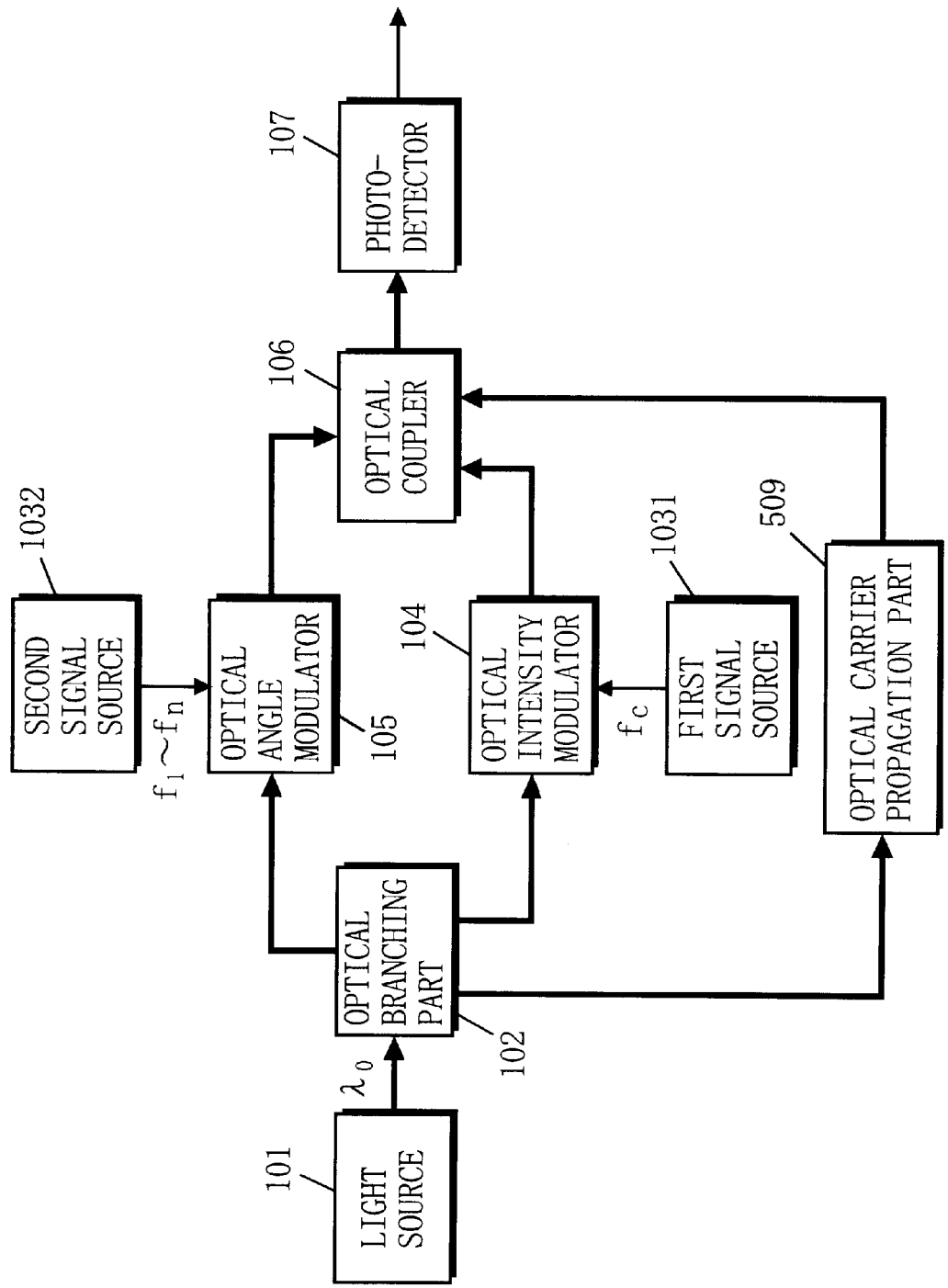
FIG. 13 is a block diagram showing the configuration of an angle modulator according to a fifth embodiment of the present invention.

FIG. 13 is a block diagram showing the configuration of an angle modulator according to a fifth embodiment of the present invention. In FIG. 13, the present angle modulator includes the light source 101, the optical branching part 102, the first and second signal sources 1031 and 1032, the optical intensity modulator 104, the optical angle modulator 105, the optical coupler 106, the photo-detector 107, and an optical carrier propagation part 509.

The present angle modulator has the configuration similar to that of the angle modulator according to the first embodiment, except that the optical carrier propagation part 509 is further provided for the angle modulator according to the first embodiment. Therefore, the same components are provided with the same reference numerals as those in FIG. 1, and their description is omitted herein. Also, the configuration of the fifth embodiment is similar to that of the first embodiment in that the optical devices and optical waveguides from the optical source 101 to the photo-detector 107 are formed on the same substrate, and therefore its description is omitted herein. The operation of the optical carrier propagation part 509 is described below.

In FIG. 13, the optical branching part 102 branches a light into first, second, and third lights. The optical carrier propagation part 509 is supplied with the third light, and adjusts the level and propagation delay amount thereof. The optical coupler 106 is supplied with a light from the optical carrier propagation part 509, and couples the light to the first and second optical signals for output.

Here, as described above, in some cases, the signal from the optical intensity modulator 104 may include a residual optical carrier component as shown in FIG. 8A. This residual optical carrier component causes an undesired residual AM component in the baseband (low-frequency band). This residual AM component interferes with the desired angle-modulated signal from the photo-detector 107 to cause deterioration in signal quality.

Therefore, in FIG. 13, the optical branching part 102 produces an unmodulated light (corresponding to an optical carrier) as the third light. The optical carrier propagation part 509 is supplied with the third light to adjusts the level and propagation delay amount thereof.

Figure 14:
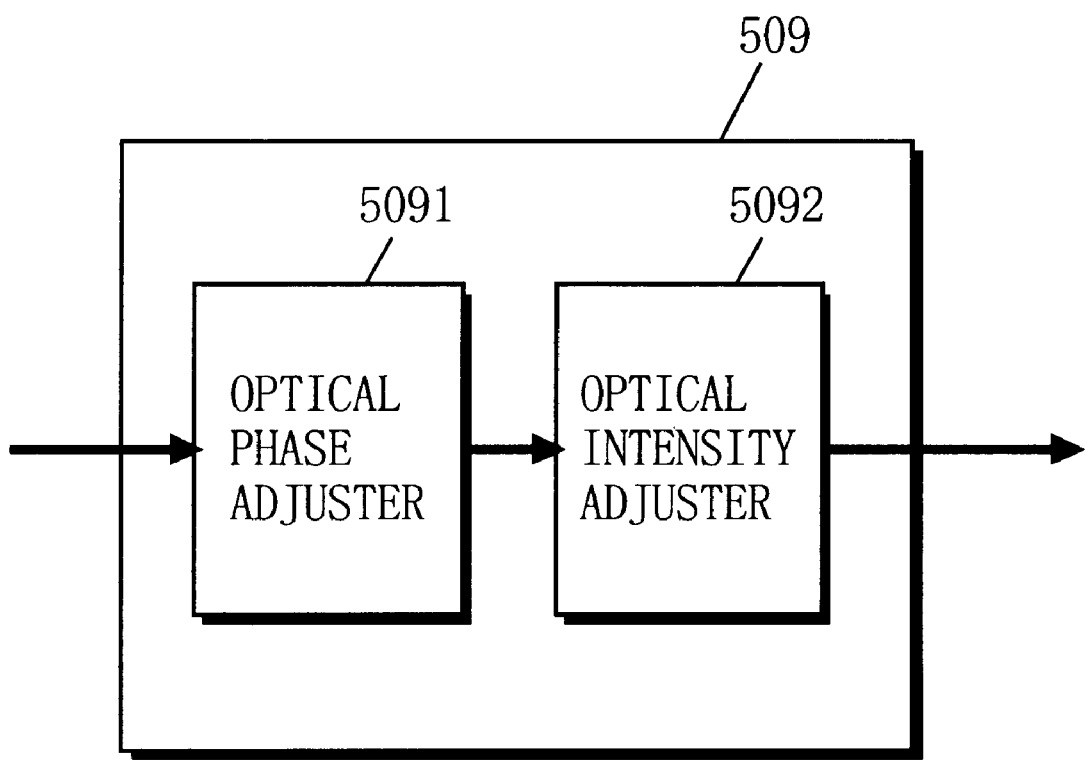
FIG. 14 is a block diagram illustrating the detailed structure of an optical carrier propagation part 509.

FIG. 14 is a block diagram showing the detailed structure of the optical carrier propagation part 509. In FIG. 14, the optical carrier propagation part 509 includes an optical phase adjuster 5091 and an optical intensity adjuster 5092.

The optical phase adjuster 5091 adjusts the optical propagation delay amount of the third light so that the supplied third light and the first optical signal have counter phases to each other on the optical coupler 106. The optical intensity adjuster 5092 adjusts the light with its propagation delay amount adjusted so that a level of the light and the residual optical carrier component of the first optical signal are equal to each other on the optical coupler 106. The light with its propagation delay amount and optical level adjusted is coupled to the first optical signal by the optical coupler 106.

Here, the light is adjusted to be equal to the residual optical carrier component of the first optical signal in magnitude and to be in counter phase thereto. Therefore, even if an optical carrier component remains in the first optical signal, the present angle modulator can accurately cancel out and suppress such residual optical carrier component to obtain an angle-modulated signal with less undesired components.

Note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Sixth Embodiment

FIG. 15 is a block diagram showing the configuration of an angle modulator according to a sixth embodiment of the present invention. In FIG. 15, the present optical modulator includes the light source 101, the optical branching part 102, the first and second signal sources 1031 and 1032, the optical intensity modulator 104, the optical angle modulator 105, the optical coupler 106, the photo-detector 107, and a filter 710.

The present angle modulator has the configuration similar to that of the angle modulator according to the first embodiment, except that the filter 710 is further provided for the angle modulator according to the first embodiment. Therefore, the same components are provided with the same reference numerals as those in FIG. 1, and their description is omitted herein. Also, the configuration of the sixth embodiment is similar to that of the first embodiment in that the optical devices and optical waveguides from the optical source 101 to the photo-detector 107 are formed on the same substrate, and therefore its description is omitted herein. The operation of the filter 710 is described below.

The filter 710 is so constructed as to pass only a desired angle-modulated signal component of the electrical signal from the photo-detector 107 and suppresses an undesired signal component.

In the optical intensity modulator 104, a harmonic spectrum may occur in the first optical signal due to non-linearity of the modulation characteristics (input voltage to output optical power characteristics). When this harmonic spectrum interferes with the second optical signal, a harmonic component occurs at a frequency n×fc (n is a natural integer) in the electrical signal from the photo-detector 107. FIG. 16 is a diagram showing a second harmonic occurring at the frequency 2×fc as a frequency spectrum. Such harmonic may interfere with a desired angle-modulated signal.

To avoid this interference, after supplied with the electrical signal from the photo-detector 107, the filter 710 allows passage of only the frequency band corresponding to the desired angle-modulated signal. Thus, the present angle modulator can obtain an angle-modulated signal with suppressed noise.

Note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Seventh Embodiment

FIG. 17 is a block diagram showing the configuration of an angle modulator according to a seventh embodiment of the present invention. In FIG. 17, the present optical modulator includes the light source 101, the optical branching part 102, the first and second signal sources 1031 and 1032, the optical intensity modulator 104, the optical angle modulator 105, the optical coupler 106, the photo-detector 107, and an optical amplifier 911.

The present angle modulator has the configuration similar to that of the angle modulator according to the first embodiment, except that the optical amplifier 911 is further provided for the angle modulator according to the first embodiment. Therefore, the same components are provided with the same reference numerals as those in FIG. 1, and their description is omitted herein. Also, the configuration of the seventh embodiment is similar to that of the first embodiment in that the optical devices and optical waveguides from the optical source 101 to the photo-detector 107 are formed on the same substrate, and therefore its description is omitted herein. The operation of the optical amplifier 911 is described below.

In FIG. 17, the optical amplifier 911 is inserted between the optical coupler 106 and the photo-detector 107. The optical amplifier 911 amplifies the optical signal from the optical coupler 106, and then supplies the amplified signal to the photo-detector 107. Such amplification raises the signal level of the angle-modulated signal supplied by the photo-detector 107, and therefore a high-quality phase-modulated signal can be obtained in the present angle modulator. Note that the optical amplifier 911 may be inserted in any position on the optical propagation path from the light source 101 through the photo-detector 107.

Note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Eighth Embodiment

Figure 18:
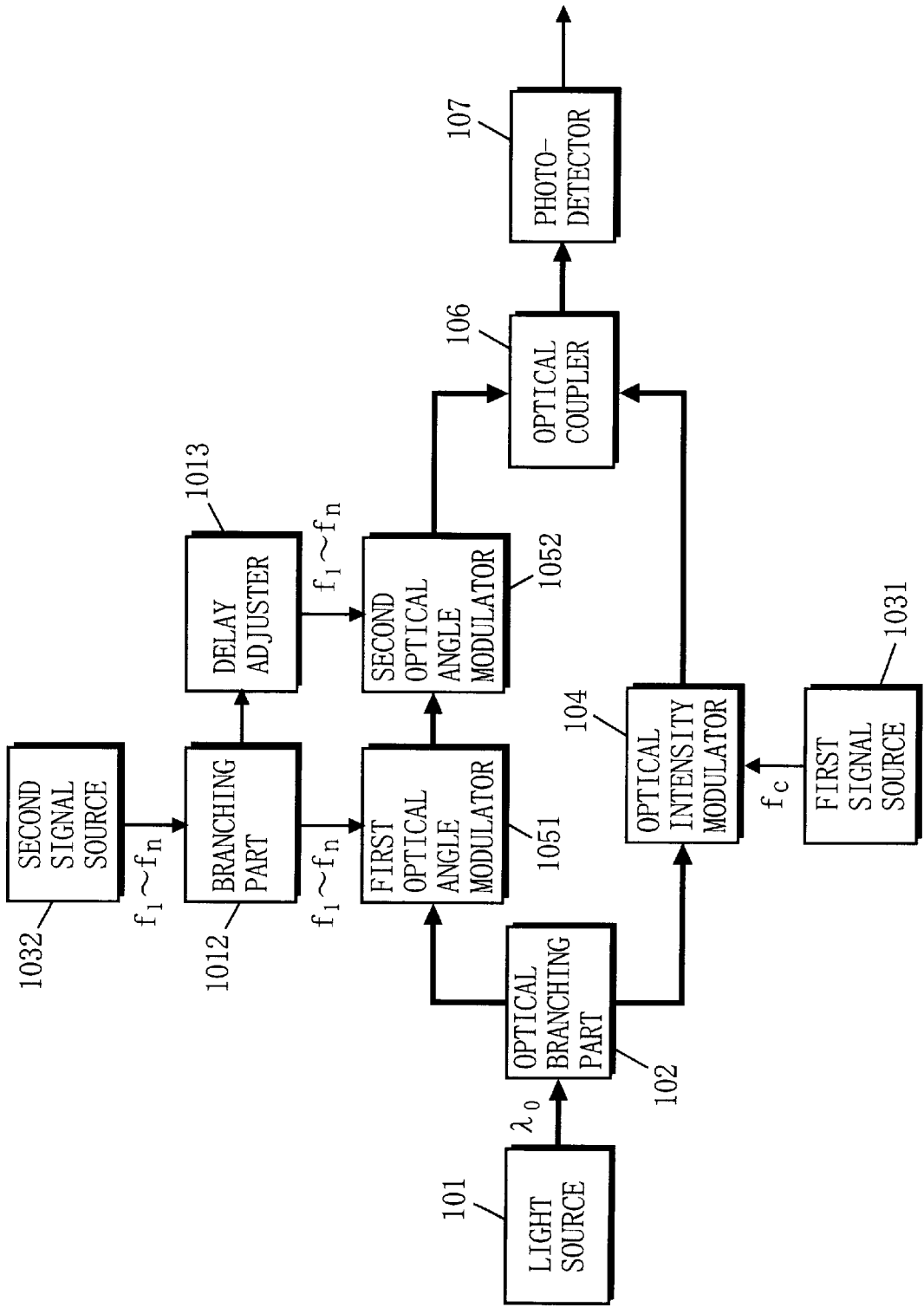
FIG. 18 is a block diagram showing the configuration of an angle modulator according to an eighth embodiment of the present invention.

FIG. 18 is a block diagram showing the configuration of an angle modulator according to an eighth embodiment of the present invention. In FIG. 18, the present optical modulator includes the light source 101, the optical branching part 102, the first and second signal sources 1031 and 1032, the optical intensity modulator 104, the optical coupler 106, the photo-detector 107, a branching part 1012, a delay adjuster 1013, and first and second optical angle modulators 1051 and 1052.

The present angle modulator has the configuration similar to that of the angle modulator according to the first embodiment, except that the first and second optical angle modulators 1051 and 1052 are provided for the angle modulator according to the first embodiment instead of the optical angle modulator 105, and the branching part 1012 and the delay adjuster 1013 are further provided therefor. Therefore, the same components are provided with the same reference numerals as those in FIG. 1, and their description is omitted herein.

Also, the configuration of the eighth embodiment is similar to that of the first embodiment in that the optical devices and optical waveguides from the optical source 101 to the photo-detector 107 are formed on the same substrate. For example, the first and second optical angle modulators 1051 and 1052 are cascaded and provided at the position of the second optical modulator 8002 in FIG. 5 or at the position of the first optical modulator 9001 in FIG. 6.

The operation of the angle modulator shown in FIG. 18 is now described. Since the configuration of the present embodiment is similar to that of the first embodiment, only the difference will be described below. In FIG. 18, the branching part 1012 branches the second electrical signal from the second signal source 1032 into two for output. Needless to say, the outputted two second electrical signals are equal in phase and frequency. For example, these signals are frequency-division-multiplexed signals on a range of frequencies between frequencies f1 and fn.

The first optical angle modulator 1051 is supplied with the second light from the optical branching part 102. With one branched second electrical signal from the branching part 1012, the first optical angle modulator 1051 subjects the input second light to optical angle modulation for output. The second optical modulator 1052 is supplied with the optical signal from the first optical angle modulator 1051. With the other branched second electrical signal whose propagation delay amount has been adjusted by the delay adjuster 1013, the second optical angle modulator 1052 subjects the input optical signal to the optical angle modulation, and produces the second optical signal.

Here, the delay adjuster 1013 adjusts the propagation delay amounts of the two second electrical signals to be equal to each other: one occurs in a path of the one second electrical signal from the branching part 1012 through the first optical angle modulator 1051 to the second optical angle modulator 1052 as the optical signal, and the other occurs in a path of the other second electrical signal from the branching part 1012 through the delay adjuster 1013 to the second optical angle modulator 1052.

The reasons why the first and second optical angle modulators 1051 and 1052 are cascaded and why the delay adjuster 1013 is provided are described below in detail.

In general, the optical angle modulator is often implemented with a substrate of an electrooptic crystal such as lithium niobate having a large electrooptic constant with optical waveguides diffused therein. Such optical modulator, however, is low in modulation efficiency, that is, low in the varying ratio of the optical phase or optical frequency to the input signal voltage. Therefore, such optical modulator requires a large voltage amplitude (specifically, over several volts p—p) for the modulating signal.

Nevertheless, it is difficult to improve the performance of an electrical amplifier for amplifying the modulating signal to be supplied to the optical modulator, and therefore its saturation output level is restricted. Thus, the saturation output level in the electrical amplifier for driving the optical modulator often restricts the modulation index of the optical modulator.

Hence, as described above, the first and second optical angle modulators 1051 and 1052 are cascaded, and each supplied with the branched second electrical signal after signal processing such as electrical amplification. Such structure reduces the load on the electrical amplifier for driving the optical modulator, resulting in more efficient optical angle modulation with large phase (or frequency) deviation. Thus, the present angle modulator can generate an angle-modulated signal with suppressed noise.

Furthermore, the delay adjuster 1013 adjusts, as described above, the propagation delay amount of the signal in a path through the first optical angle modulator 1051 to the second optical angle modulator 1052 and the propagation delay amount of the signal in a path through the delay adjuster 1013 to the second optical angle modulator 1052 to become equal to each other. With this adjustment, it is possible to accurately equalize the phase states of optical angle modulation with the second electrical signal on the first and second optical angle modulators 1051 and 1052. Therefore, the present angle modulator enables more efficient optical angle modulation, generating an angle-modulated signal with lower noise.

Note that, since being provided in order to equalize the propagation delay amounts of the two signals, the delay adjuster 1013 may be inserted between the branching part 1012 and the first optical angle modulator 1051. Therefore, the delay adjuster 1013 may be inserted between the branching part 1012 and the first optical angle modulator 1051 and/or between the branching part 1012 and the second optical angle modulator 1052. Alternatively, the delay adjuster 1013 may be omitted as required.

Furthermore, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Ninth Embodiment

Figure 19:
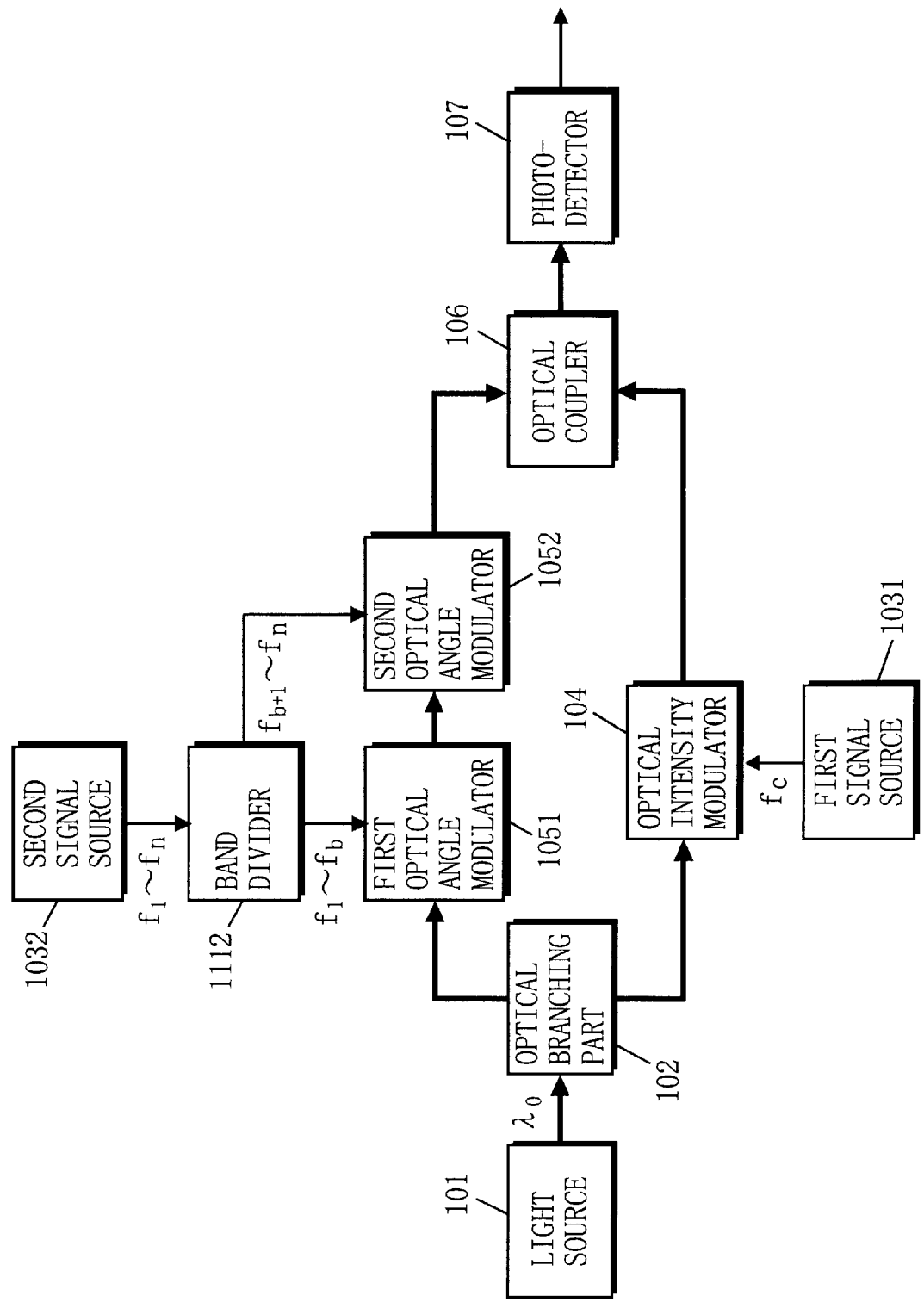
FIG. 19 is a block diagram showing the configuration of an angle modulator according to a ninth embodiment of the present invention.

FIG. 19 is a block diagram showing the configuration of an angle modulator according to a ninth embodiment of the present invention. In FIG. 19, the present optical modulator includes the light source 101, the optical branching part 102, the first and second signal sources 1031 and 1032, the optical intensity modulator 104, the optical coupler 106, the photo-detector 107, a band divider 1112, and the first and second optical angle modulators 1051 and 1052.

The present angle modulator has the configuration similar to that of the angle modulator according to the eighth embodiment, except that the band divider 1112 is provided instead of the branching part 1012, and the delay adjuster 1013 is omitted. Therefore, the same components are provided with the same reference numerals as those in FIG. 18, and their description is omitted herein.

Also, the configuration of the ninth embodiment is similar to that of the eighth embodiment in that the optical devices and optical waveguides from the optical source 101 to the photo-detector 107 are formed on the same substrate.

The operation of the present angle modulator shown in FIG. 19 is now described. Since the configuration of the present embodiment is similar to that of the eighth embodiment, only the difference will be described below. In FIG. 19, the band divider 1112 divides the second electrical signal from the second signal source 1032 by frequency band for output. For example, the band divider 1112 divides the second electrical signal, which is a frequency-division-multiplexed signal on the range of frequencies between f1 and fn into a first frequency-division-multiplexed signal on a band of frequencies between f1 and fb (where f1<fb<fn) and a second frequency-division-multiplexed signal on a band of frequencies between fb+1 and fn.

The first optical angle modulator 1051 is supplied with the second light from the optical branching part 102. With the first frequency-division-multiplexed signal from the band divider 1112, the first optical angle modulator 1051 subjects the input second light to optical angle modulation for output. The second optical angle modulator 1052 is supplied with the optical signal from the first optical angle modulator 1051. With the second frequency-division-multiplexed signal from the band divider 1112, the second optical angle modulator 1052 subjects the input optical signal to optical angle modulation, and produces the second optical signal.

The reasons why the above band divider 1112 is provided is now described. As stated in the eighth embodiment, the general optical modulator constructed of an electrooptic crystal is low in modulation efficiency, and the saturation output level of the electrical amplifier is restricted. Therefore, it is difficult to ensure sufficient phase (or frequency) deviation as required. On the other hand, in general, as the frequency bandwidth of a signal to be amplified is narrower, the saturation output level of the electrical amplifier tends to become larger.

Hence, as described above, the first and second optical angle modulators 1051 and 1052 are cascaded, and each supplied with the second electrical signal obtained through band division by predetermined frequency band after signal processing such as electrical amplification. Such structure increases output of the electrical amplifier for driving the optical modulator, resulting in more efficient optical angle modulation with large phase (or frequency) deviation. Thus, the present angle modulator can generate an angle-modulated signal with lower noise.

Furthermore, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Tenth Embodiment

Figure 20:
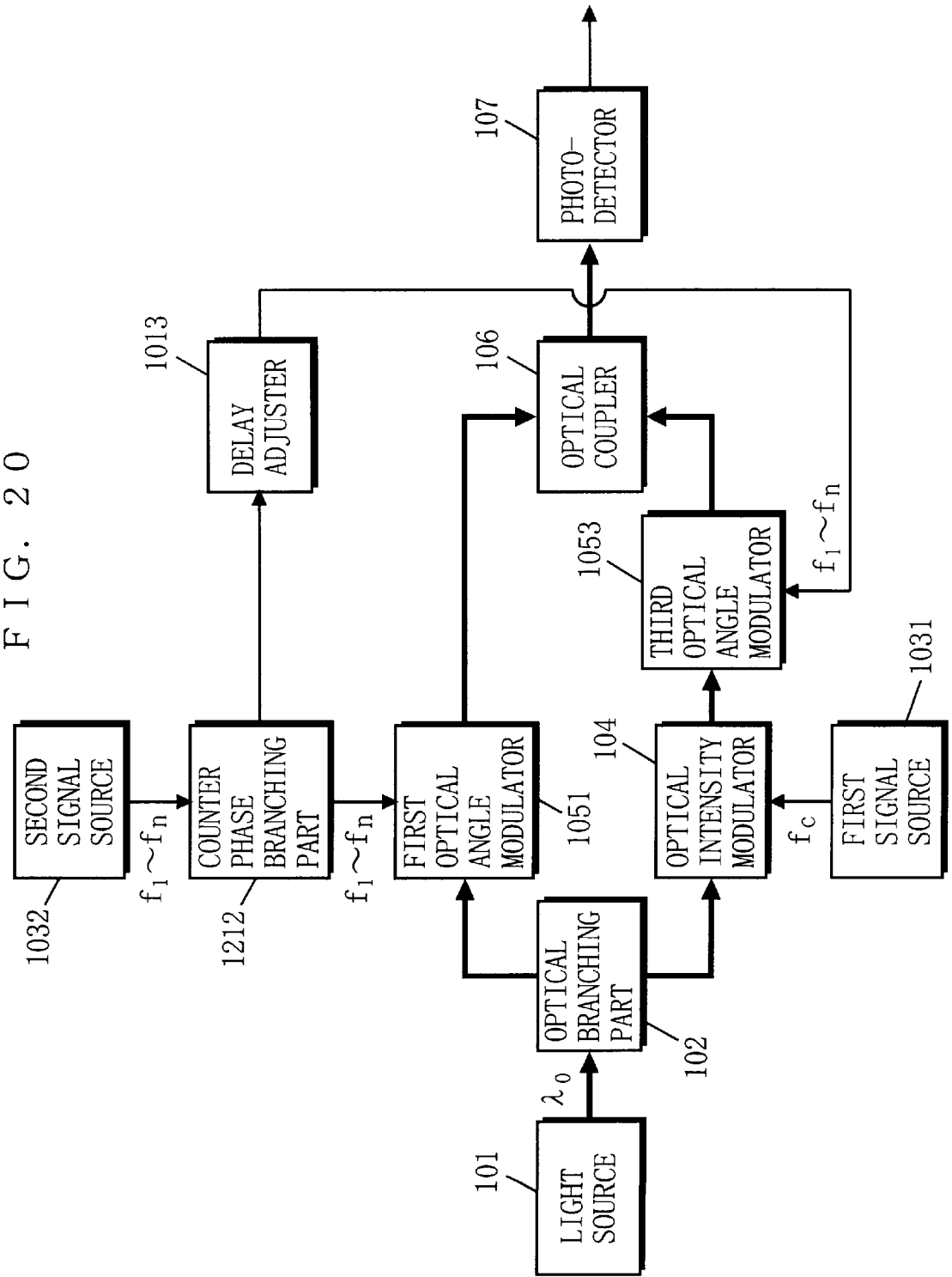
FIG. 20 is a block diagram showing the configuration of an angle modulator according to a tenth embodiment of the present invention.

FIG. 20 is a block diagram showing the configuration of an angle modulator according to a tenth embodiment of the present invention. In FIG. 20, the present optical modulator includes the light source 101, the optical branching part 102, the first and second signal sources 1031 and 1032, the optical intensity modulator 104, the optical coupler 106, the photo-detector 107, a counter phase branching part 1212, the delay adjuster 1013, the first optical angle modulator 1051, and a third optical angle modulator 1053.

The present angle modulator has the configuration similar to that of the angle modulator according to the eighth embodiment, except that the counter phase branching part 1212 is provided instead of the branching part 1012 in the angle modulator according to the eighth embodiment; the second optical angle modulator 1052 is omitted; and the third optical angle modulator 1053 is newly provided between the optical intensity modulator 104 and the optical coupler 106. Therefore, the same components are provided with the same reference numerals as those in the eighth embodiment, and their description is omitted herein.

The operation of the angle modulator shown in FIG. 20 is now described. Since the configuration of the present embodiment is similar to that of the eighth embodiment, only the difference will be described below. In FIG. 20, the counter phase branching part 1212 branches the second electrical signal from the second signal source 1032, and produces two signals having counter phases to each other.

The first optical angle modulator 1051 is supplied with the second light from the optical branching part 102. With the one branched second electrical signal from the counter phase branching part 1212, the first optical angle modulator 1051 subjects the input second light to optical angle modulation, and produces the first optical signal. The third optical angle modulator 1053 is supplied with the optical signal from the optical-intensity-modulator 104. With the electrical signal from the delay adjuster 1013 after branching by the counter phase branching part 1212, the third optical angle modulator 1053 subjects the input optical signal to optical angle modulation, and produces the second optical signal.

Here, the delay adjuster 1013 adjusts two propagation delay amounts of the two second electrical signals to be equal to each other: one occurs in a path of one second electrical signal from counter phase branching part 1212 through the first optical angle modulator 1051 to the optical coupler 106 as the optical signal, and the other occurs in a path of the other second electrical signal from the counter phase branching part 1212 through the delay adjuster 1013 and then the third optical angle modulator 1053 to the optical coupler 106 as the optical signal.

The reasons why the above third optical angle modulator 1053 is provided is now described. As stated in the eighth embodiment, the general optical modulator constructed of an electrooptic crystal is low in modulation efficiency, and the saturation output level of the electrical amplifier is restricted. Therefore, it is difficult to ensure sufficient phase (or frequency) deviation required. Hence, in the eighth embodiment, another optical angle modulator is additionally provided and cascaded into the existing one. In the present embodiment, however, the additional optical angle modulator is cascaded into the optical intensity modulator 104. The second electrical signal is branched into two having counter phases to each other by the counter phase branching part 1212, and after signal processing such as electrical amplification, these branched two signals are supplied to the optical angle modulators. Such structure reduces the load on the electrical amplifier for driving the optical modulator, resulting in more efficient optical angle modulation with large phase (or frequency) deviation. Thus, the present angle modulator can generate an angle-modulated signal with lower noise.

The phase deviation in optical angle modulation exerted on the first optical signal by the third optical angle modulator 1053 is in counter phase to the phase deviation in optical angle modulation exerted on the second optical signal by the first optical angle modulator 1051. Therefore, the counter phase branching part 1212 branches the second electrical signal into two in counter phases to each other. Such branching enables the optical angle deviations of the first and second optical signals that are coupled in the optical coupler 106 to become in phase. Therefore, such structure can increase the phase deviation of the angle-modulated signal to be outputted from the photo-detector 107 more efficiently.

Furthermore, the delay adjuster 1013 adjusts the propagation delay amounts in the above described manner to accurately equalize the phase states of optical angle modulation in the first and third optical angle modulators 1051 and 1053. Therefore, the delay adjuster 1013 may be inserted between the counter phase branching part 1212 and the first optical angle modulator 1051 and/or between the counter phase branching part 1212 and the third optical angle modulator 1053. Further, the delay adjuster 1013 may even be omitted as required.

Still further, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Eleventh Embodiment

Figure 21:
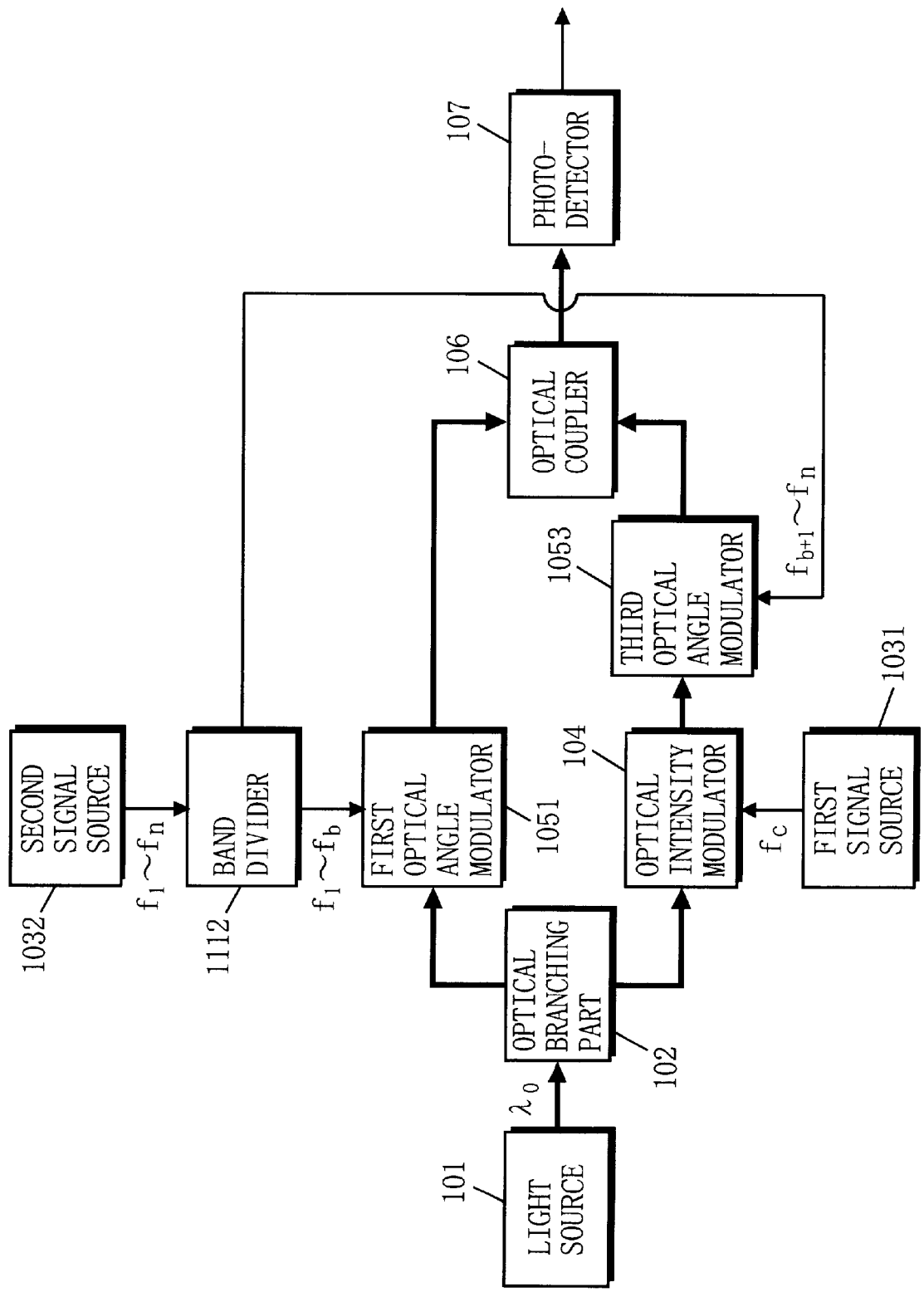
FIG. 21 is a block diagram showing the configuration of an angle modulator according to an eleventh embodiment of the present invention.

FIG. 21 is a block diagram showing the configuration of an angle modulator according to an eleventh embodiment of the present invention. In FIG. 21, the present optical modulator includes the light source 101, the optical branching part 102, the first and second signal sources 1031 and 1032, the optical intensity modulator 104, the optical coupler 106, the photo-detector 107, the band divider 1112, and the first and third optical angle modulators 1051 and 1053.

The present angle modulator has the configuration similar to that of the angle modulator according to the ninth embodiment, except that the third optical angle modulator 1053 is provided instead of the second optical angle modulator 1052 of the angle modulator according to the ninth embodiment. Therefore, the same components are provided with the same reference numerals as those in FIG. 19, and their description is omitted herein.

The operation of the angle modulator shown in FIG. 21 is now described. The configuration of the present embodiment is similar to that of the ninth embodiment, and also similar to that of the tenth embodiment in that the third optical angle modulator 1053 is provided instead of the second optical angle modulator 1052. That is, another optical angle modulator is cascaded into the existing one in the ninth embodiment, while being cascaded into the optical intensity modulator 104 in the present embodiment, as in the tenth embodiment.

As such, like in the ninth embodiment, the band divider 1112 divides the second electrical signal by predetermined frequency band and, after signal processing such as electrical amplification, supplies each divided signal to the corresponding optical angle modulator. Such structure increases output of the electrical amplifier for driving the optical modulator, resulting in more efficient optical angle modulation with large phase (or frequency) deviation. Thus, the present angle modulator can generate an angle-modulated signal with lower noise.

Furthermore, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

As described above, the angle modulators according to the eighth to eleventh embodiments can carry out efficient optical modulation to generate an angle-modulated signal with larger deviation and lower noise, independent of the performance of the electrical amplifier for driving the optical modulator.

Twelfth Embodiment

Figure 22:
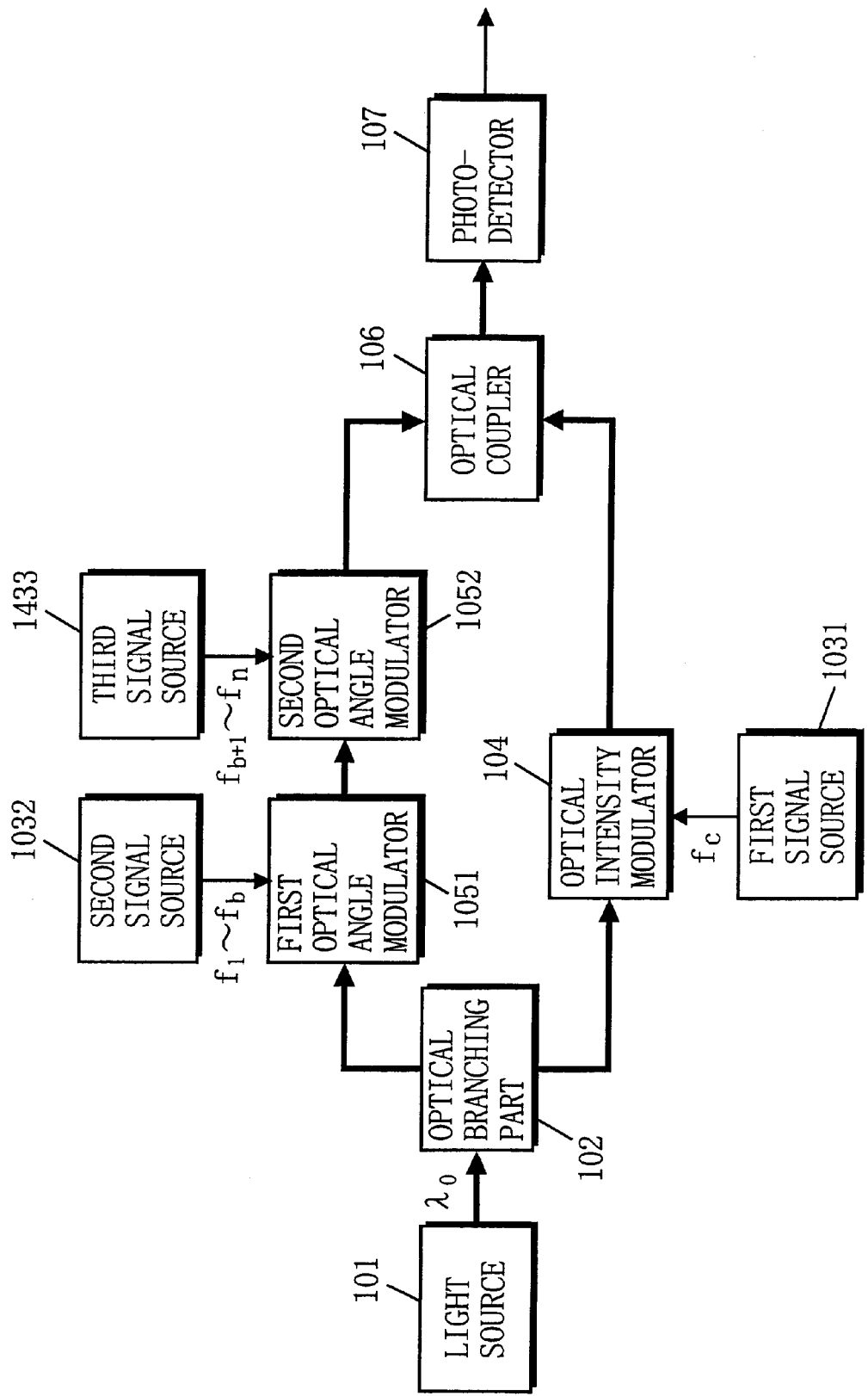
FIG. 22 is a block diagram showing the configuration of an angle modulator according to a twelfth embodiment of the present invention.

FIG. 22 is a block diagram showing the configuration of an angle modulator according to a twelfth embodiment of the present invention. In FIG. 22, the present angle modulator includes the light source 101, the optical branching part 102, the first and second signal sources 1031 and 1032, a third signal source 1433, the optical intensity modulator 104, the optical coupler 106, the photo-detector 107, and the first and second optical angle modulators 1051 and 1052.

The present angle modulator has the configuration similar to that of the angle modulator according to the eighth embodiment, except that the band divider 1112 of the angle modulator according to the eighth embodiment is omitted herein, and the third signal source 1433 is newly provided. Therefore, the same components are provided with the same reference numerals as those in FIG. 19, and their description is omitted herein.

Also, the configuration of the twelfth embodiment is similar to that of the eighth embodiment in that the optical devices and optical waveguides from the optical source 101 to the photo-detector 107 are formed on the same substrate.

The operation of the present angle modulator shown in FIG. 22 is now described. The configuration of the present embodiment is similar to that of the eighth embodiment. However, unlike the angle modulator of the eighth embodiment, which divides the second electrical signal from the second signal source 1032 by predetermined frequency band, the present angle modulator sets in advance the second electrical signal from the second signal source 1032 and a third electrical signal from the third signal source 1433 to be different in frequency band. For example, the second electrical signal is a frequency-division-multiplexed signal on a band of frequencies between f1 to fb (where f1<fb<fn), while the third electrical signal is a frequency-division-multiplexed signal on a band between the frequencies fb+1 to fn.

As such, the band divider 1112 can be omitted if the second and third electrical signals are previously set to be different in frequency band. Also, in reality, the modulating signals supplied to the optical angle modulators may be externally provided as two signals having different frequency bands. Therefore, the present angle modulator supplies these two signals directly to the corresponding optical angle modulators, thereby achieving, with a simple structure, reduction in load on the electrical amplifier for driving the optical modulator and more efficient optical angle modulation with large phase (or frequency) deviation. Thus, the present angle modulator can generate an angle-modulated signal with lower noise.

Furthermore, even if the number of signal sources is further increased, only required is providing and inserting additional optical angle modulator(s) accordingly. Therefore, the present angle modulator can easily and flexibly cope with an increase in the number of signal sources without changing the other components.

Still further, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Thirteenth Embodiment

Figure 23:
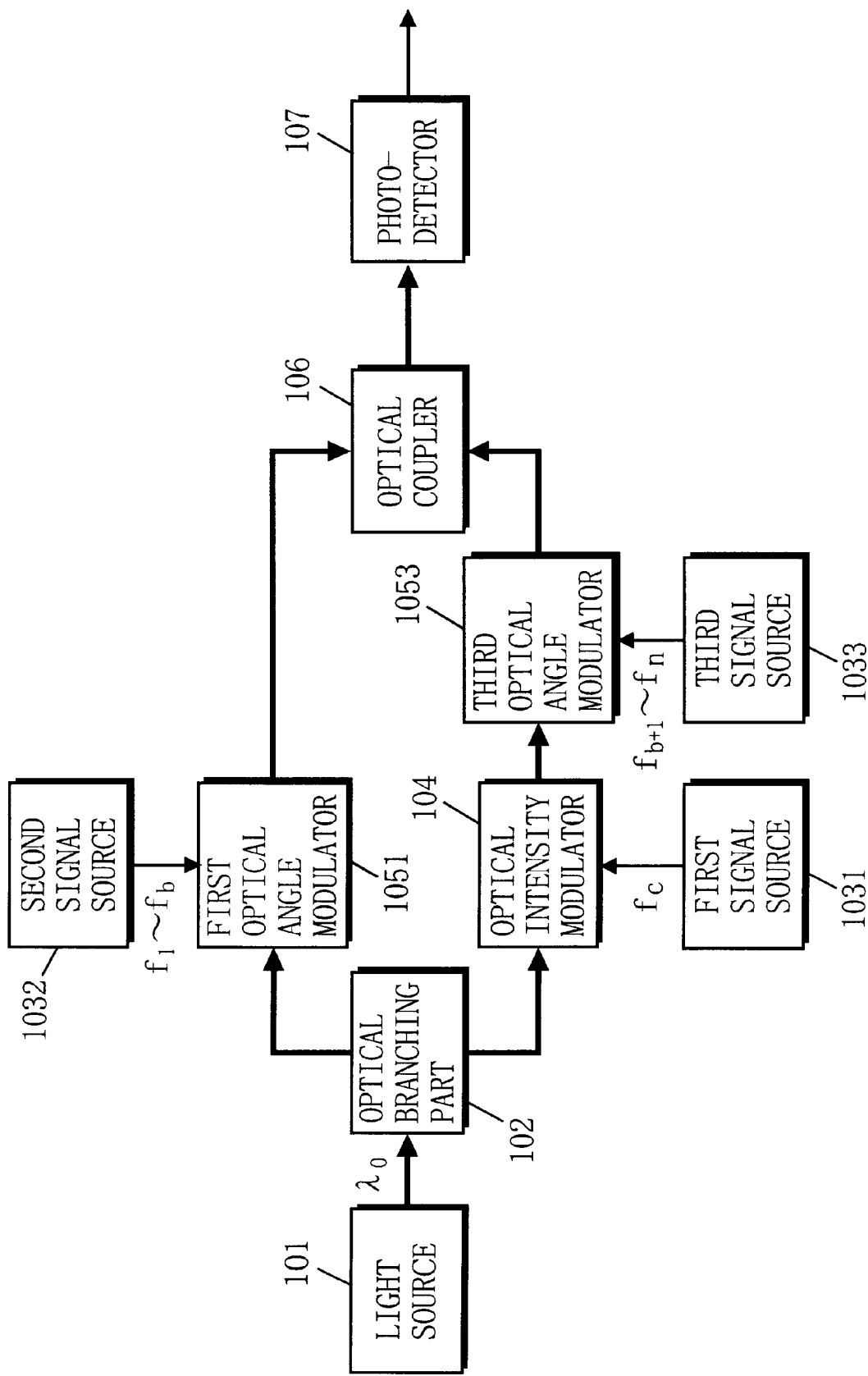
FIG. 23 is a block diagram showing the configuration of an angle modulator according to a thirteenth embodiment of the present invention.

FIG. 23 is a block diagram showing the configuration of an angle modulator according to a thirteenth embodiment of the present invention. In FIG. 23, the present optical modulator includes the light source 101, the optical branching part 102, the first and second signal sources 1031 and 1032, a third signal source 1033, the optical intensity modulator 104, the optical coupler 106, the photo-detector 107, and the first and third optical angle modulators 1051 and 1053.

The present angle modulator has the configuration similar to that of the angle modulator according to the eleventh embodiment, except that the band divider 1112 is omitted herein and the third signal source 1033 is newly provided. Therefore, the same components are provided with the same reference numerals as those in FIG. 21, and their description is omitted herein. Moreover, compared with the angle modulator according to the twelfth embodiment, the third signal source 1033 is inserted in a different position.

The operation of the angle modulator shown in FIG. 23 is now described. The configuration of the present embodiment is similar to that of the eleventh embodiment. However, unlike the angle modulator of the eleventh embodiment, which divides the second electrical signal from the second signal source 1032 by predetermined frequency band, the present angle modulator sets in advance the second electrical signal from the second signal source 1032 and a third electrical signal from the third signal source 1033 to be different in frequency band. For example, like in the twelfth embodiment, the second electrical signal is set to be a frequency-division-multiplexed signal on a band between the frequencies f1 to fb (where f1<fb<fn), while the third electrical signal is set to be a frequency-division-multiplexed signal on a band between the frequencies fb+1 to fn.

As such, like the angle modulator according to the twelfth embodiment, the present angle modulator supplies these two signals having different frequency bands directly to the corresponding optical angle modulators, thereby achieving, with a simple structure, reduction in load on the electrical amplifier for driving the optical modulator and more efficient optical angle modulation with large phase (or frequency) deviation. Thus, the present angle modulator can generate an angle-modulated signal with lower noise.

Furthermore, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having the phase difference closer to that theoretically required.

Fourteenth Embodiment

Figure 24:
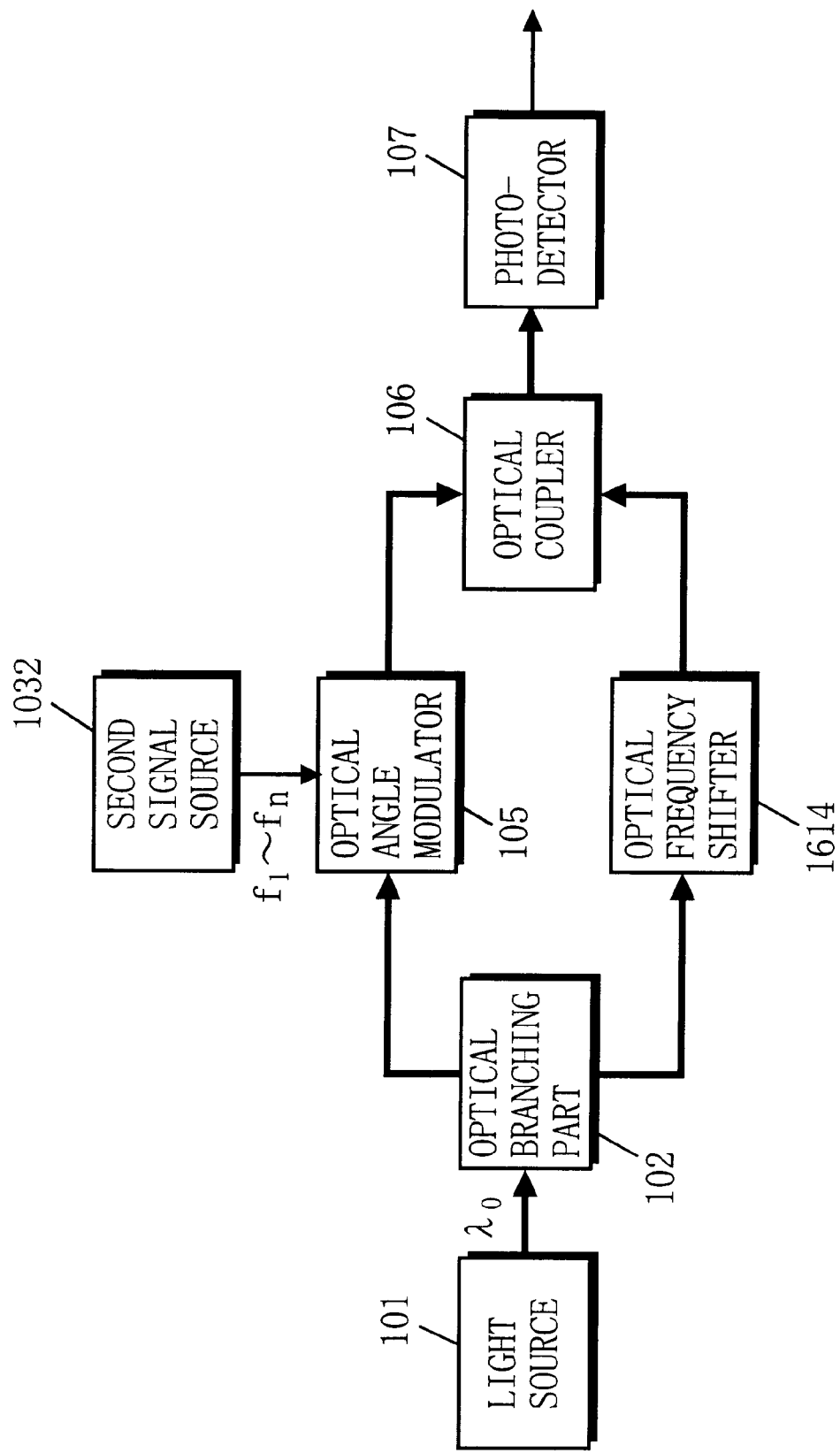
FIG. 24 is a block diagram showing the configuration of an angle modulator according to a fourteenth embodiment of the present invention.

FIG. 24 is a block diagram showing the configuration of an angle modulator according to a fourteenth embodiment of the present invention. In FIG. 24, the present optical modulator includes the light source 101, the optical branching part 102, the second signal source 1032, the optical coupler 106, the photo-detector 107, and an optical frequency shifter 1614.

The present angle modulator has the configuration similar to that of the angle modulator according to the first embodiment, except that the optical frequency shifter 1614 is newly provided instead of the first signal source 1031 and the optical intensity modulator 104 in the angle modulator according to the first embodiment. Therefore, the same components are provided with the same reference numerals as those in FIG. 1, and their description is omitted herein. Only the difference is described below.

In FIG. 24, the optical frequency shifter 1614 is supplied with the first light from the optical branching part 102, shifts the optical frequency thereof by a predetermined amount fc, and then produces the first optical signal.

Figure 25A:
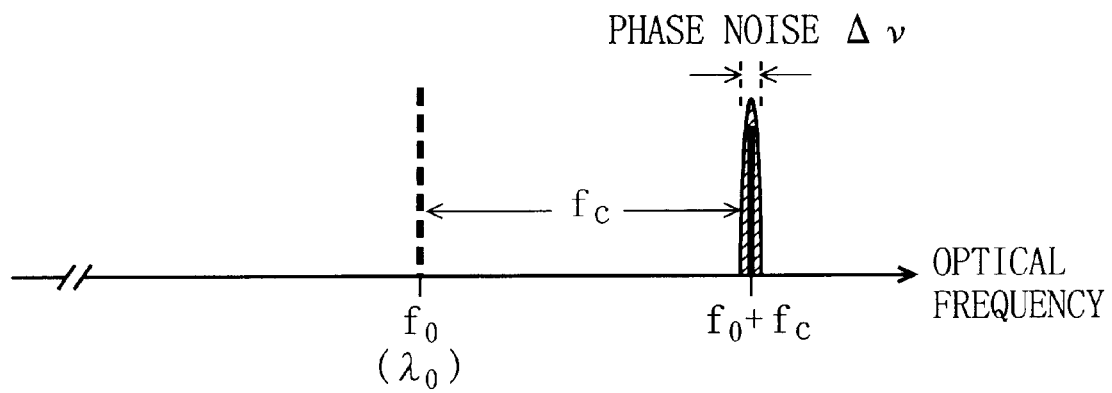
FIG. 25A is a schematic diagram illustrating an optical spectrum of a first optical signal outputted from an optical frequency shifter 1614 in the fourteenth embodiment.
Figure 25B:
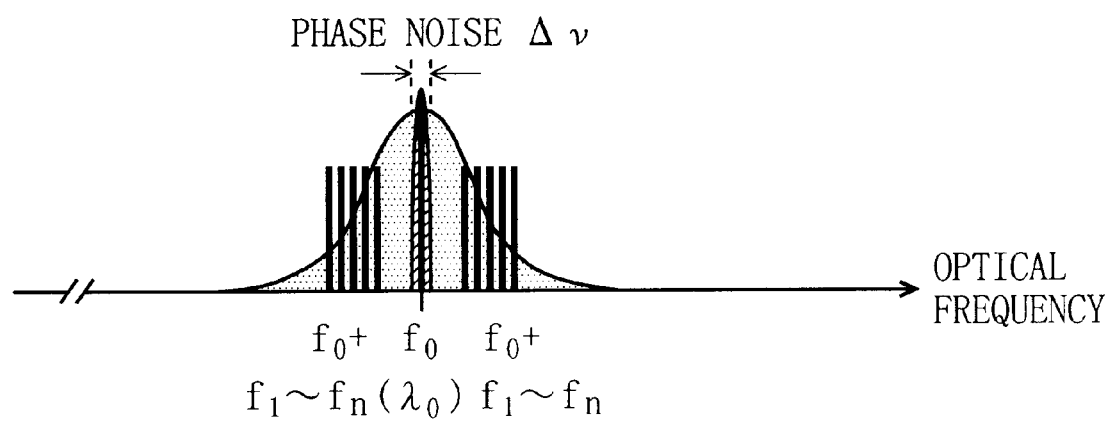
FIG. 25B is a schematic diagram illustrating an optical spectrum of a second optical signal outputted from the optical angle modulator 105 in the case of FIG. 25A.
Figure 25C:
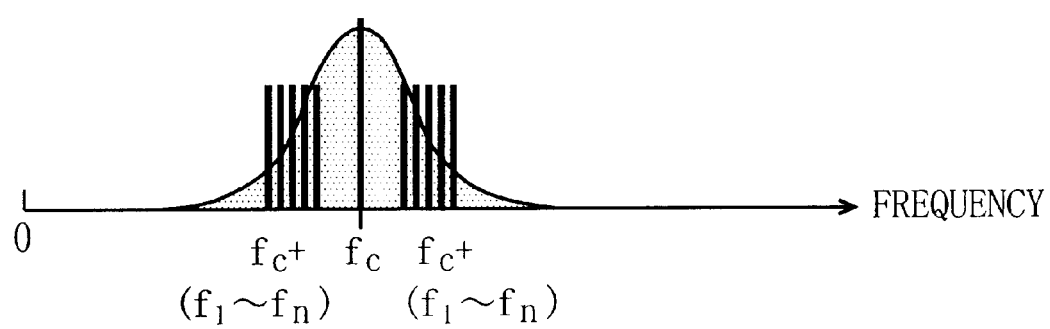
FIG. 25C is a schematic diagram illustrating the frequency spectrum of the angle-modulated signal outputted from the optical detector 107 in the case of FIG. 25A.
Figure 26:
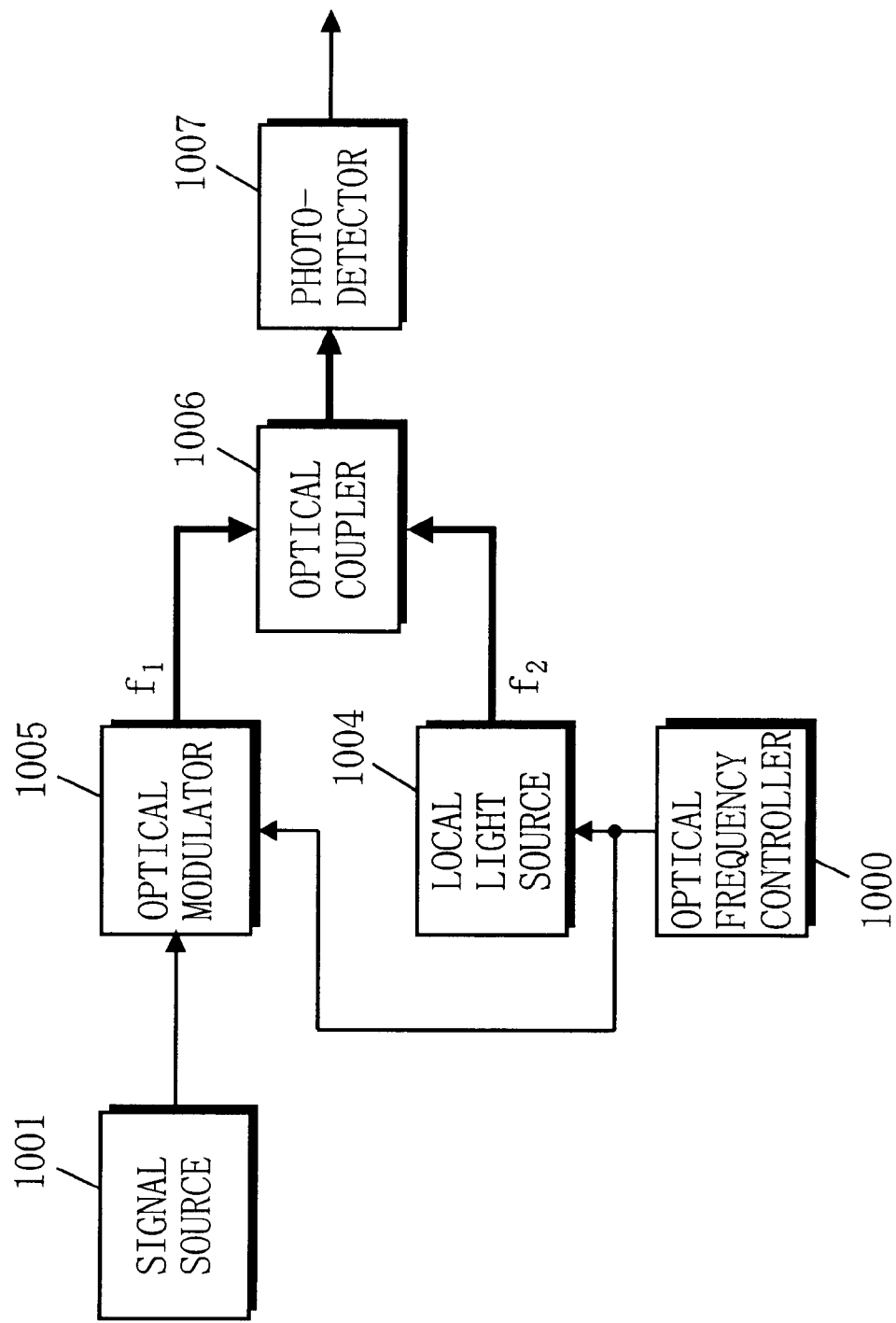
FIG. 26 is a block diagram showing the configuration of a conventional angle modulator.
Figure 27A:
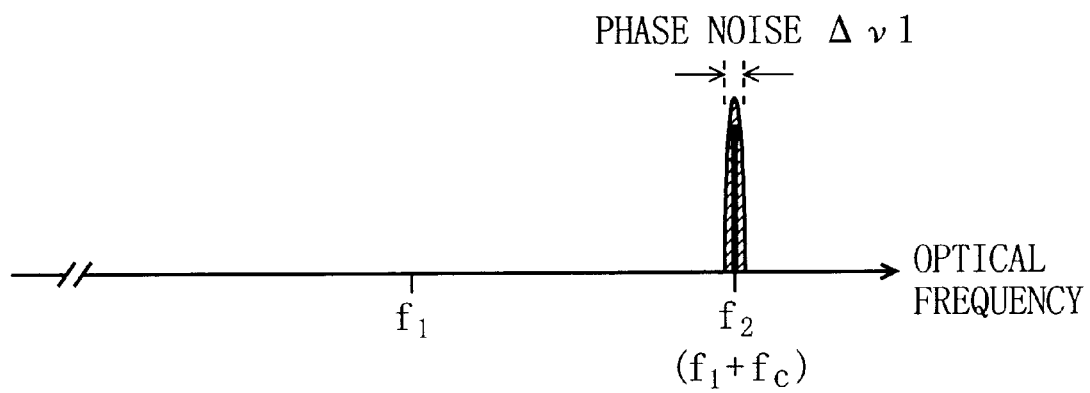
FIG. 27A is a frequency spectrum of a light outputted from a local light source 1004.
Figure 27B:
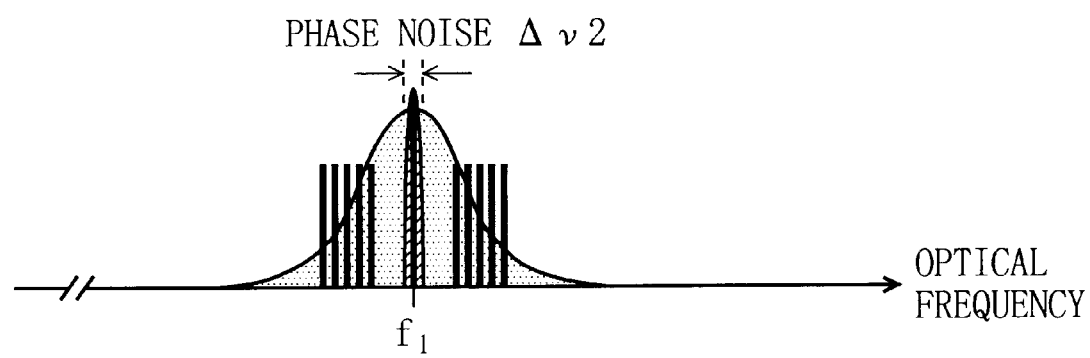
FIG. 27B is a frequency spectrum of a light outputted from an optical modulator 1005.
Figure 27C:
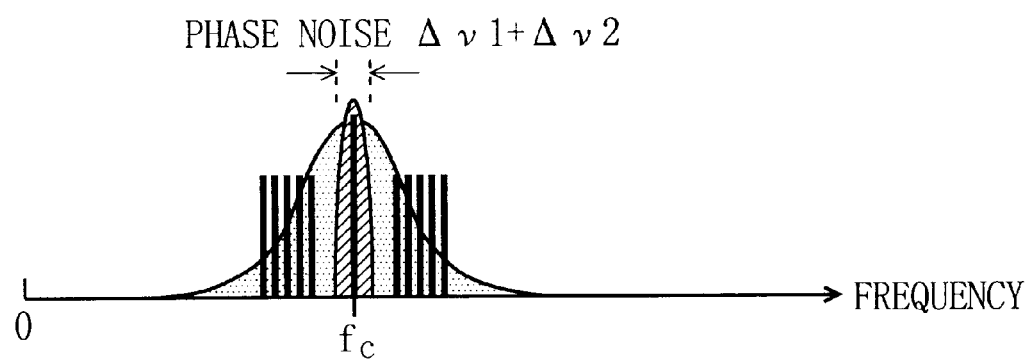
FIG. 27C is a frequency spectrum of a signal outputted from a photo-detector 1007.

The effect of phase noise suppression is now described using FIGS. 25A to 25C. FIG. 25A is a schematic diagram illustrating one example of an optical spectrum of the first optical signal outputted from the optical frequency shifter. As shown FIG. 25A, the first optical signal from the optical frequency shifter 1614 has the same phase noise Δv as that of the first light from the optical branching part 102 (that is, the light emitted from the light source 101), because the first optical signal is the first light frequency-shifted by fc.

FIG. 25B is a schematic diagram illustrating one example of an optical spectrum of the second optical signal outputted from the optical angle modulator 105. As shown in FIG. 25B, the second optical signal is an optical-angle-modulated signal as shown in FIG. 2B. Therefore, the first and second optical signals have the phase noise Δv equivalent to that in the light source 101. Thus, as shown in FIG. 2C, both phase noises are cancelled out in the angle-modulated signal of a beat component. FIG. 25C is a schematic diagram illustrating a frequency spectrum of the angle-modulated signal outputted from the photo-detector 107.

As described above, according to the present embodiment, based on the light emitted from the same light source, the optical signal obtained with the light shifted in optical frequency and the optical signal obtained though optical angle modulation of the light are homodyne-detected, thereby generating an angle-modulated signal with low noise.

Furthermore, note that, as in the second or third embodiment, the present angle modulator may further be provided with the controller 108 or 608 to adjust the operating conditions of the optical intensity modulator 104. With such controller, the optical intensity modulator 104 can generate two optical phase-modulated signals having a phase difference closer to that theoretically required.

While the invention has been described in detail, the foregoing description is in all aspects illustrative and not restrictive. It is understood that numerous other modifications and variations can be devised without departing from the scope of the invention.

What is claimed is:

1. An angle modulator for converting an input modulating signal into an angle-modulated signal through homodyne detection, comprising:

a light source emitting a light;

an optical branching part branching the light emitted by said light source into a first light and a second light;

an optical intensity modulator performing optical intensity modulation or optical amplitude modulation on said first light with a first electrical signal having a predetermined frequency fc, and outputting an optical-intensity-modulated or optical-amplitude-modulated signal as a first optical signal;

a first optical angle modulator performing optical angle modulation on said second light with a second electrical signal, which is said input modulating signal, and outputting an optical-angle-modulated signal as a second optical signal;

an optical coupler coupling said first and second optical signals; and a photo-detector with a square-law detection characteristic converting an optical signal outputted from said optical coupler into an electrical signal and outputting the electrical signal as said angle-modulated signal having a carrier frequency fc.

2. The angle modulator according to claim 1, wherein said optical intensity modulator performs single-sideband optical intensity modulation or single-sideband optical amplitude modulation.

3. The angle modulator according to claim 1, wherein said optical intensity modulator performs optical intensity modulation or optical amplitude modulation with an optical carrier suppressed.

4. The angle modulator according to claim 3, wherein said optical intensity modulator is implemented as a Mach-Zehnder interferometer whose bias voltage is adjusted so as to minimize output light intensity.

5. The angle modulator according to claim 1, wherein said optical intensity modulator performs single-sideband optical intensity modulation or single-sideband optical amplitude modulation with an optical carrier suppressed.

6. The angle modulator according to claim 5, wherein said optical intensity modulator is implemented as a Mach-Zehnder interferometer whose bias voltage is adjusted so as to minimize output light intensity.

7. The angle modulator according to claim 1, wherein optical propagation time in a path from optical branching part through said optical intensity modulator to said optical coupler is approximately equal to optical propagation time in a path from said optical branching part rough said first optical angle modulator to said optical coupler.

8. The angle modulator according to claim 7, wherein said optical intensity modulator is implemented as a Mach-Zehnder interferometer including first and second optical phase modulators, and optical propagation time in a path from said optical branching part through said first optical phase modulator to said optical coupler is equal to optical propagation time in a path from said optical branching part through said second optical phase modulator to said optical coupler.

9. The angle modulator according to claim 8, wherein the optical propagation time in the path from said optical branching part through said first optical phase modulator to said optical coupler, the optical propagation time in the path from said optical branching part through said second optical phase modulator to said optical coupler, and the optical propagation time in the path from said optical branching part through said optical angle modulator to said optical coupler are equal to one another.

10. The angle modulator according to claim 7, wherein a bias voltage of said first optical angle modulator is adjusted to equalize the optical propagation time in the path from said optical branching part through said optical intensity modulator to said optical coupler and the optical propagation time in the path from said optical branching part through said first optical angle modulator to said optical coupler.

11. The angle modulator according to claim 7, further comprising:

an optical delay adjuster, inserted in one or both of said paths, for equalizing the optical propagation time in the path from said optical branching part through said optical intensity modulator to said optical coupler and the optical propagation time in the path from said optical branching part through said first optical angle modulator to said optical coupler.

12. The angle modulator according to claim 1, wherein all or part of said optical intensity modulator, said first optical angle modulator, and optical waveguides from said light source through said optical intensity modulator or said first optical angle modulator to said photo-detector is formed on a same crystal substrate.

13. The angle modulator according to claim 1, further comprising:

a controller controlling operating conditions of said optical intensity modulator so as to maximize a level of said angle-modulated signal outputted from said photo-detector.

14. The angle modulator according to claim 13, wherein said optical intensity modulator is implemented as a Mach-Zehnder interferometer, and said controller adjusts a bias voltage of said optical intensity modulator so as to maximize the level of said angle-modulated signal.

15. The angle modulator according to claim 13, wherein said optical intensity modulator is implemented as a push/pull-type Mach-Zehnder interferometer having two electrical signal input terminals that branches said first electrical signal into first and second modulating signals having a predetermined phase relation with each other and supplies said first and second modulating signals to said two electrical signal input terminals, and said controller adjusts a phase difference between said first and second modulating signals so as to maximize the level of said angle-modulated signal.

16. The angle modulator according to claim 1, further comprising:
a controller controlling operating conditions of said optical intensity modulator so as to minimize a level of a low-frequency component corresponding to said second electrical signal, said low-frequency component being generated in said photo-detector through homodyne detection of said optical-angle-modulated signal and a residual optical carrier component included in said optical-intensity-modulated signal.

17. The angle modulator according to claim 14, wherein
said optical intensity modulator is implemented as a Mach-Zehnder interferometer, and
said controller adjusts a bias voltage of said optical intensity modulator so as to minimize the level of said low-frequency component.

18. The angle modulator according to claim 17, wherein
said optical intensity modulator is implemented as a push/pull-type Mach-Zehnder interferometer having two electrical signal input terminals,
said first electrical signal is branched into first and second modulating signals having a predetermined phase relation with each other and said first and second modulating signals are supplied to said two electrical signal input terminals, and
said controller adjusts a phase difference between said first and second modulating signals so as to minimize the level of said low-frequency component.

19. The angle modulator according to claim 1, further comprising:
a controller controlling operating conditions of said optical intensity modulator so as to maximize a level of a signal component having a frequency 2fc that is equivalent to a double harmonic of said first electrical signal, said signal component being generated in said photo-detector through homodyne detection of upper-sideband and lower-sideband components included in said optical-intensity-modulated signal.

20. The angle modulator according to claim 19, wherein
said optical intensity modulator is implemented as a Mach-Zehnder interferometer, and
said controller adjusts a bias voltage of said optical intensity modulator so as to maximize the level of said signal component equivalent to the double harmonic of said first electrical signal.

21. The angle modulator according to claim 19, wherein
said optical intensity modulator is implemented as a push/pull-type Mach-Zehnder interferometer having two electrical signal input terminals,
said first electrical signal is branched into first and second modulating signals having a predetermined phase relation with each other and said first and second modulating signals are supplied to said two electrical signal input terminals, and
said controller adjusts a phase difference between said first and second modulating signals so as to maximize the level of said signal component equivalent to the double harmonic of said first electrical signal.

22. The angle modulator according to claim 1, further comprising:
a controller receiving an optical signal divided from said first optical signal outputted from said optical intensity modulator, converting the optical signal into an electrical signal by the square-law detection characteristic, and controlling operating conditions of said optical intensity modulator so as to minimize a level of a signal component having a frequency fc that is equivalent to said first electrical signal included in the electrical signal.

23. The angle modulator according to claim 22, wherein
said optical intensity modulator is implemented as a Mach-Zehnder interferometer, and
said controller adjusts a bias voltage of said optical intensity modulator so as to minimize the level of said signal component equivalent to said first electrical signal.

24. The angle modulator according to claim 22, wherein
said optical intensity modulator is implemented as a push/pull-type Mach-Zehnder interferometer having two electrical signal input terminals,
said first electrical signal is branched into first and second modulating signals having a predetermined phase relation with each other and said first and second modulating signals are supplied to said two electrical signal input terminals, and
said controller adjusts a phase difference between said first and second modulating signals so as to minimize the level of said signal component equivalent to said first electrical signal.

25. The angle modulator according to claim 1, further comprising:
a controller receiving an optical signal divided from said first optical signal outputted from said optical intensity modulator, converting the optical signal into an electrical signal by a square-law detection characteristic, and controlling operating conditions of said optical intensity modulator so as to maximize a level of a signal component having a frequency 2fc that is equivalent to a double harmonic of said first electrical signal included in the electrical signal.

26. The angle modulator according to claim 25, wherein
said optical intensity modulator is implemented as a Mach-Zehnder interferometer, and
said controller adjusts a bias voltage of said optical intensity modulator so as to maximize the level of said signal component equivalent to the double harmonic of said first electrical signal.

27. The angle modulator according to claim 25, wherein
said optical intensity modulator is implemented as a push/pull-type Mach-Zehnder interferometer having two electrical signal input terminals,
said first electrical signal is branched into first and second modulating signals having a predetermined phase relation with each other and said first and second modulating signals are supplied to said two electrical signal input terminals, and
said controller adjusts a phase difference between said first and second modulating signals so as to maximize the level of said signal component equivalent to the double harmonic of said first electrical signal.

28. The angle modulator according to claim 1, wherein
said optical branching part branches the light emitted by said source into the first light, the second light, and a third light;
said optical coupler couples said first light, second light, and third light; and
said angle modulator further comprises an optical carrier propagation part adjusting optical power and an optical propagation delay amount of said third light so that an optical carrier component included in the first optical signal outputted from said optical intensity modulator is suppressed in said optical coupler.

29. The angle modulator according to claim 28, wherein said optical carrier propagation part includes
   an optical phase adjuster adjusting the propagation delay amount of said third light to be in counter phase with said first optical signal; and
   an optical intensity adjuster adjusting the power of said third light to become equal to power of the optical carrier component included in said first optical signal.

30. The angle modulator according to claim 1, further comprising:
   one or more optical amplifiers, inserted in any of propagation paths from said light source through said photo-detector, optical-amplifying light on said propagation paths.

31. The angle modulator according to claim 1, further comprising:
   a filter receiving the electrical signal outputted from said photo-detector and passing only an angle-modulated signal component having the carrier frequency fc.

32. The angle modulator according to claim 1, further comprising:
   a branching part branching said second electrical signal into two; and
   a second optical angle modulator performing optical-angle-modulation on said second optical signal outputted from said first optical angle modulator with one branched second electrical signal by said branching part, wherein
   said first optical angle modulator performs optical angle modulation with a remaining branched second electrical signal.

33. The angle modulator according to claim 32, wherein propagation time required for the one branched second electrical signal from said branching part to reach said second optical angle modulator is equal to propagation time for the remaining branched second electrical signal from said branching part to reach said second optical angle modulator through said first optical angle modulator.

34. The angle modulator according to claim 33, further comprising:
   a delay adjuster, inserted in one or both of a signal path from said branching part to said first optical angle modulator and a signal path from said branching part to said second optical angle modulator, for equalizing the propagation time required for the one branched second electrical signal from said branching part to reach said second optical angle modulator and the propagation time for the remaining branched second electrical signal from said branching part to reach said second optical angle modulator through said first optical angle modulator.

35. The angle modulator according to claim 1, further comprising:
   a band divider dividing a frequency band of said second electrical signal into two; and
   a second optical angle modulator performing optical angle modulation on said second optical signal outputted from said first optical angle modulator with one band-divided second electrical signal from said band divider, wherein
   said first optical angle modulator performs optical angle modulation with a remaining band-divided second electrical signal from said band divider.

36. The angle modulator according to claim 1, further comprising:
   a counter phase branching part branching said second electrical signal into two branched second electrical signals in counter phases to each other; and
   a third optical angle modulator performing optical angle modulation on said first optical signal outputted from said optical intensity modulator with one branched second electrical signal from said counter phase branching part, wherein
   said first optical angle modulator performs optical angle modulation with a remaining branched second electrical signal from said counter phase branching part.

37. The angle modulator according to claim 36, wherein propagation time required for the one branched second electrical signal from said counter phase branching part to reach said optical coupler through said third optical angle modulator is equal to propagation time for the remaining branched second electrical signal from said counter phase branching part to reach said optical coupler through said first optical angle modulator.

38. The angle modulator according to claim 37, wherein a delay adjuster, inserted in one or both of a signal path from said counter phase branching part to said first optical angle modulator and a signal path from said counter phase branching part to said third optical angle modulator, for equalizing the propagation time required for the one branched second electrical signal from said counter phase branching part to reach said optical coupler through said third optical angle modulator and the propagation time for the remaining branched second electrical signal from said counter phase branching part to reach said optical coupler through said first optical angle modulator.

39. The angle modulator according to claim 1, further comprising:
   a band divider dividing a frequency band of said second electrical signal into two; and
   a third optical angle modulator performing optical angle modulation on said first optical signal outputted from said optical angle modulator with one band-divided second electrical signal from said band divider, wherein
   said first optical angle modulator performs optical angle modulation with a remaining band-divided second electrical signal from said band divider.

40. The angle modulator according to claim 1, further comprising:
   a second optical modulator performing optical angle modulation on said second optical signal outputted from said first optical angle modulator with a third electrical signal, wherein
   said third electrical signal is said modulating signal that is different in frequency band from said second electrical signal.

41. The angle modulator according to claim 1, further comprising:
   a third optical modulator performing optical angle modulation on said first optical signal outputted from said optical intensity modulator with a third electrical signal, wherein
   said third electrical signal is said modulating signal that is different in frequency band from said second electrical signal.

42. An angle modulator for converting an input modulating signal into an angle-modulated signal through homodyne detection, comprising:

a light source emitting a light;

an optical branching part branching the light emitted by said source into a first light and a second light;

an optical frequency shifter performing frequency conversion or frequency shifting of an optical frequency of said first light for a predetermined amount fc, and outputting as a first optical signal;

an optical angle modulator performing optical angle modulation on said second light with said input modulating signal, and outputting an optical-angle-modulated signal as a second optical signal;

an optical coupler coupling said first and second optical signals; and a photo-detector with a square-law detection characteristic converting an optical signal outputted from said optical coupler into an electrical signal and outputting the electrical signal as said angle-modulated signal having a carrier frequency fc.

43. A method for converting an input modulating signal into an angle-modulated signal through homodyne detection, comprising the steps of:

branching light emitted by a light source into a first light and a second light;

generating a first optical signal including a signal component of an optical frequency shifted from an optical frequency of said first light for a predetermined amount fc;

generating a second optical signal through optical angle modulation on said second light with the input modulating signal;

coupling said first optical signal and said second optical signal; and converting the coupled optical signals into an electrical signal through homodyne detection and outputting said angle-modulated signal having a carrier frequency fc.

* * * * *